US012696651B2

(12) United States Patent
Choi et al.

(10) Patent No.: US 12,696,651 B2
(45) Date of Patent: Jul. 28, 2026

(54) ORGANIC LIGHT EMITTING DISPLAY DEVICE WITH AT LEAST ONE LIGHT BLOCKING LAYER

(71) Applicant: LG Display Co., Ltd., Seoul (KR)

(72) Inventors: Mingeun Choi, Paju-si (KR); Kimin Lim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/775,651

(22) Filed: Jul. 17, 2024

(65) Prior Publication Data

US 2025/0255139 A1     Aug. 7, 2025

(30) Foreign Application Priority Data

Feb. 1, 2024    (KR) ........................ 10-2024-0015768

(51) Int. Cl.
| | |
|---|---|
| *H10K 59/50* | (2023.01) |
| *G02B 5/20* | (2006.01) |
| *G02B 5/26* | (2006.01) |
| *H10K 59/122* | (2023.01) |
| *H10K 59/80* | (2023.01) |
| *H10K 59/90* | (2026.01) |

(52) U.S. Cl.
CPC ............. *H10K 59/50* (2023.02); *G02B 5/206* (2013.01); *G02B 5/26* (2013.01); *H10K 59/122* (2023.02); *H10K 59/8791* (2023.02); *H10K 59/90* (2023.02); *G02F 2201/343* (2013.01)

(58) Field of Classification Search
CPC ........................ H10K 59/122; H10K 59/8791
See application file for complete search history.

(56) References Cited

U.S. PATENT DOCUMENTS

| | | | | |
|---|---|---|---|---|
| 5,757,448 A | * | 5/1998 | Takei | G02F 1/1334 |
| | | | | 349/86 |
| 2005/0190316 A1 | * | 9/2005 | Takahashi | G02F 1/134363 |
| | | | | 349/44 |
| 2022/0392978 A1 | * | 12/2022 | Bae | H10K 50/865 |

FOREIGN PATENT DOCUMENTS

| | | | | |
|---|---|---|---|---|
| CN | 11-1129076 | * 5/2020 | ............. | G06F 3/044 |
| JP | 5-203931 | * 8/1993 | .......... | G02F 1/1333 |
| KR | 2018-0087823 | * 8/2018 | .......... | H01L 51/502 |
| KR | 10-2019-0023404 A | 3/2019 | | |
| KR | 2019-0023404 | * 3/2019 | ............. | H10K 59/38 |
| KR | 10-2238632 B1 | 4/2021 | | |

\* cited by examiner

*Primary Examiner* — Lauren Nguyen
(74) *Attorney, Agent, or Firm* — Fenwick & West LLP

(57) ABSTRACT

An organic light emitting display device includes a substrate, a first sub-pixel on the substrate, the first sub-pixel emitting light of a first color, and a second sub-pixel on the substrate, the second sub-pixel emitting light of a second color different from the first color. The organic light emitting display device further includes a first bank layer between the first sub-pixel and the second sub-pixel, and a first light blocking layer under the first bank layer. The first light blocking layer includes a first liquid crystal capsule having a first size, and the first light blocking layer reflects at least one of the light of the first color and the light of the second color.

24 Claims, 11 Drawing Sheets

SPa1, SPa2

ORGANIC LIGHT EMITTING DISPLAY DEVICE WITH AT LEAST ONE LIGHT BLOCKING LAYER

CROSS-REFERENCE TO RELATED APPLICATION

This application claims the priority of Republic of Korea Patent Application No. 10-2024-0015768 filed on Feb. 1, 2024, which is hereby incorporated by reference in its entirety.

BACKGROUND

Field

The present disclosure relates to an organic light emitting display device.

Description of the Related Art

As the information society develops, the demand for display devices for displaying images is increasing in various forms. Accordingly, various display devices such as a liquid crystal display (LCD), a plasma display panel (PDP), and an organic light emitting display (OLED) have recently been used.

Among the display devices, the organic light emitting display device is a self-luminous type, has an excellent viewing angle and contrast ratio compared to a liquid crystal display (LCD), and does not require a separate backlight, so it is possible to be lightweight and thin, and power consumption is advantageous. In addition, the organic light emitting display device has the advantage of being able to drive a DC low voltage, a fast response speed, and particularly low manufacturing cost.

The organic light emitting display device has a structure in which an organic light emitting diode including an emission layer is provided between a cathode injecting electrons and an anode injecting holes. The organic light emitting display device is a display device using the principle that when electrons generated at the cathode and holes generated at the anode are injected into the emission layer, the injected electrons and holes combine to generate excitons, and the generated excitons fall from an excited state to a ground state thereby emitting light.

When using an electronic device, for example, a mobile phone, etc., an infrared sensor (IR sensor) is attached to an organic light emitting display device, the infrared sensor can detect it as part of the light emitting layer provided on the top or side of the bank that divides multiple pixels emits light, which can cause a problem in that the infrared sensor detects light emitted from the pixel.

SUMMARY

The present disclosure has been made in view of the above problems, and it is an object of the present disclosure to provide an organic light emitting display device that minimizes the problem of light reaching a sensor by blocking light generated from a light emitting layer provided on the upper or side of a bank defining a plurality of pixels by a light blocking layer.

In accordance with an aspect of the present disclosure, the above and other objects can be accomplished by the provision of an organic light emitting display device comprising a substrate, a first sub-pixel on the substrate, the first sub-pixel emitting light of a first color, a second sub-pixel on the substrate, the second sub-pixel emitting light of a second color different from the first color, a first bank layer between the first sub-pixel and the second sub-pixel, and a first light blocking layer under the first bank layer, wherein the first light blocking layer includes a first liquid crystal capsule having a first size, and the first light blocking layer reflects at least one of the light of the first color and the light of the second color.

Furthermore, the above and other objects can be accomplished by the provision of an organic light emitting display device comprising a substrate, a plurality of first sub-pixels on the substrate, the plurality of first sub-pixels emitting light of a first color, a plurality of second sub-pixels on the substrate, the plurality of second sub-pixels emitting light of a second color, a first bank layer between a first sub-pixel of the plurality of first sub-pixels and a second sub-pixel of the plurality of second sub-pixels, the first bank layer extending in a first direction, a second bank layer disposed between adjacent first sub-pixels of the plurality of first sub-pixels, the second bank layer extending in a second direction, a first light blocking layer overlapping the first bank layer, a second light blocking layer overlapping the second bank layer, and a sensor module under the substrate, the sensor module detecting light, wherein the sensor module overlaps the first light blocking layer and the second light blocking layer.

BRIEF DESCRIPTION OF THE DRAWINGS

The above and other objects, features and other advantages of the present disclosure will be more clearly understood from the following detailed description taken in conjunction with the accompanying drawings, in which:

FIG. 4 is a plan view of an organic light emitting display device according to an embodiment of the present disclosure. In this case, FIG. 4 is an enlarged plan view of a region a of FIG. 1.

FIG. 10 is a cross-sectional view of an organic light emitting display device according to another embodiment of the present disclosure. In this case, FIG. 10 corresponds to the cross section IV-IV' of FIG. 9.

DETAILED DESCRIPTION

Figure 1:
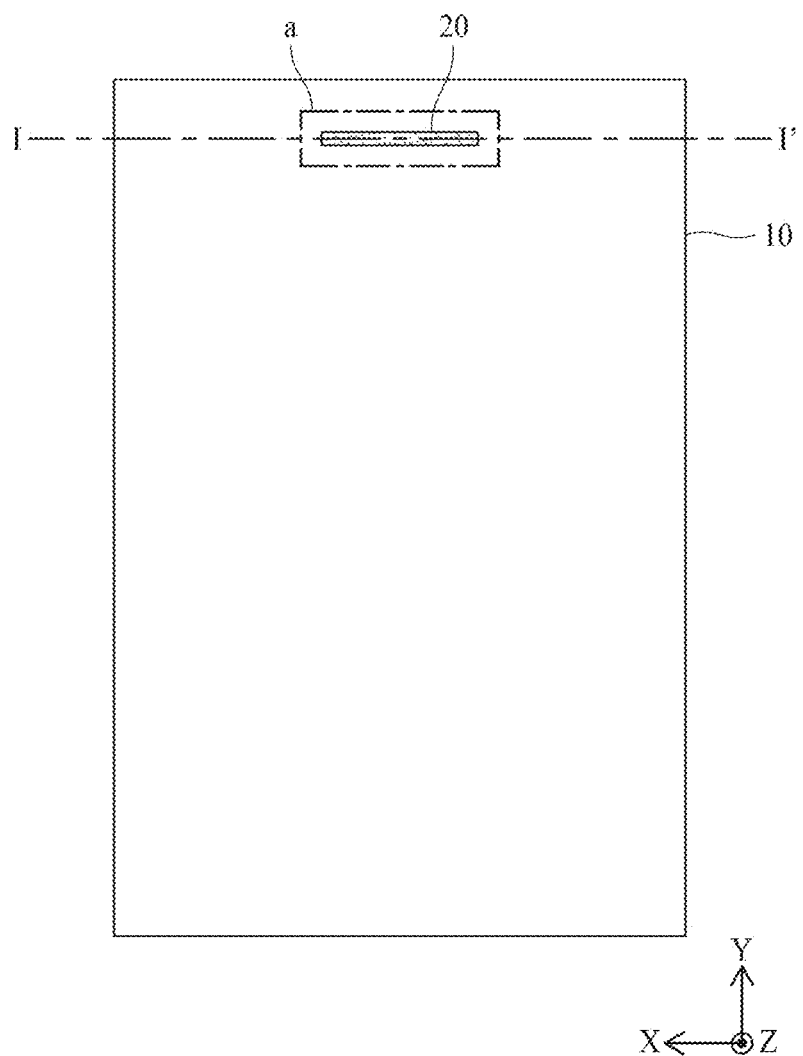
FIG. 1 is a plan view of an organic light emitting display device according to an embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used.

If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a plan view of an organic light emitting display device according to an embodiment of the present disclosure.

As shown in FIG. 1, the organic light emitting display device according to an embodiment of the present disclosure may include a display module 10 and a sensor module 20. According to an embodiment of the present disclosure, the display module 10 may provide an image and a video.

The sensor module 20 may sense light of a specific wavelength band. The sensor module 20 may sense light of an infrared wavelength band, for example, light of a wavelength range of greater than or equal to 700 nm and less than or equal to 1400 nm, and preferably, light of a wavelength range of greater than or equal to 900 nm and equal to or less than 1000 nm. The sensor module 20 may be adjusted to an on-off state by sensing light of an infrared wavelength band. For example, the sensor module 20 may be in an on state by sensing light of an infrared wavelength band emitted from a human face. In this case, the sensor module 20 may generate an electric signal by recognizing information of a human face. In addition, when light of an infrared wavelength band is not detected, the sensor module 20 may be in an off state and may not recognize information of a human face.

The sensor module 20 may be provided to overlap a part of the display module 10. Although not shown in FIG. 1 in detail, a plurality of pixels provided in the display module 10 may overlap the sensor module 20. This will be described in more detail with reference to FIG. 4.

Figure 2:
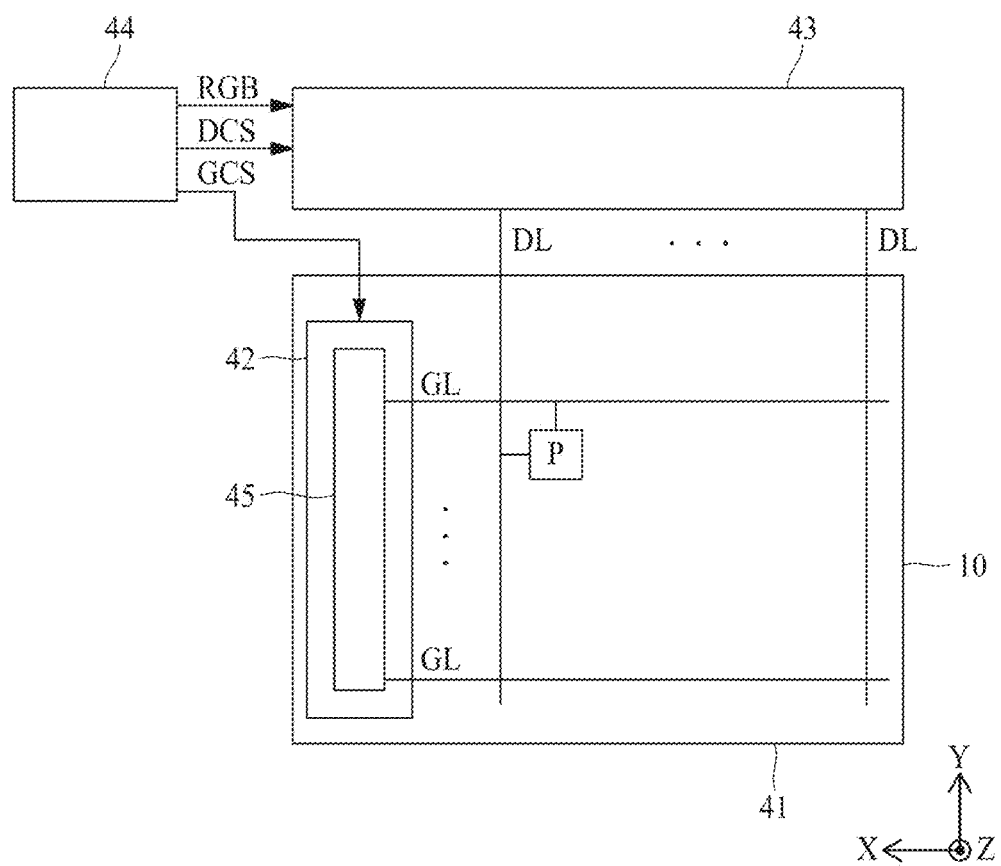
FIG. 2 is a schematic plan view of an organic light emitting display device according to an embodiment of the present disclosure.

FIG. 2 is a schematic plan view of an organic light emitting display device according to an embodiment of the present disclosure.

As shown in FIG. 2, the organic light emitting display device according to an embodiment of the present disclosure may include a display panel 41, a gate driver 42, a data driver 43, and a controller 44.

The display panel 41 may include gate lines GLs and data lines DLs, and a pixel P may be disposed in an intersection area between the gate lines GLs and the data lines DLs. An image may be displayed by driving the pixel P.

The controller 44 may control the gate driver 42 and the data driver 43. The controller 44 may output a gate control signal GCS for controlling the gate driver 42 and a data control signal DCS for controlling the data driver 43 using a signal supplied from an external system (not shown). Also, the controller 44 may sample the input image data inputted from the external system, rearrange the sampled input image data, and supply the rearranged digital image data RGB to the data driver 43.

The gate control signal GCS may include a gate start pulse GSP, a gate shift clock GSC, a gate output enable signal GOE, a start signal Vst, a gate clock GCLK, and the like. Also, the gate control signal GCS may include control signals for controlling the shift register.

The data control signal DCS may include a source start pulse SSP, a source shift clock signal SSC, a source output enable signal SOE, a polarity control signal POL, and the like.

The data driver 43 may supply a data voltage to the data lines DL of the display panel 41. Specifically, the data driver 43 may convert the image data RGB inputted from the controller 44 into an analog data voltage, and supply the analog data voltage to the data lines DL. The data driver 43 may be configured with at least one data IC. In this case, as an example, the data IC of the data driver 43 may be connected to the non-display region NA on a corresponding one side of the display panel 41, or may be mounted directly on the non-display region NA. As an example, the data IC of the data driver 43 may be mounted on a flexible circuit film and connected to the non-display region NA on a corresponding one side of the display panel 41.

The gate driver 42 may be mounted on the display panel 41. As such, the structure in which the gate driver 42 is directly mounted on the display panel 41 is referred to as a gate in panel (GIP) structure, without being limited thereto. As an example, the gate driver 42 may not be provided in the non-display area, e.g., the gate driver 42 may be connected to the display panel 41, in a tape automated bonding (TAB) method, a chip on glass (COG) method, a chip on panel (COP) method, or a chip on film (COF) method, without being limited thereto.

The gate driver 42 may include a shift register 45.

The shift register 45 may sequentially supply a gate pulse to the gate lines GL during one frame using the start signal and the gate clock transmitted from the controller 44. In this case, one frame refers to a period in which one image is output through the display panel 41. The gate pulse may have a turn-on voltage capable of turning on the switching element (thin film transistor) disposed in the pixel P. In the GIP structure, the transistors for the shift registers 45 of the gate driver 42 are directly formed on the upper surface of the substrate. As an example, at least one of the transistors for shift registers 45 of the gate driver 42 may be formed in the same process and/or in a same structure as at least one of the transistors for driving the pixels in the display area DA, without being limited thereto. As an example, at least one of the transistors for the shift registers 45 of the gate driver 42 may be separately formed from the transistors for driving the pixels in the display area DA.

In addition, the shift register 45 may supply a gate-off signal capable of turning off the switching element to the gate line GL during the remaining period in which the gate pulse is not supplied during one frame. The gate pulse and the gate-off signal may be collectively referred to as a gate signal GS.

Figure 3:
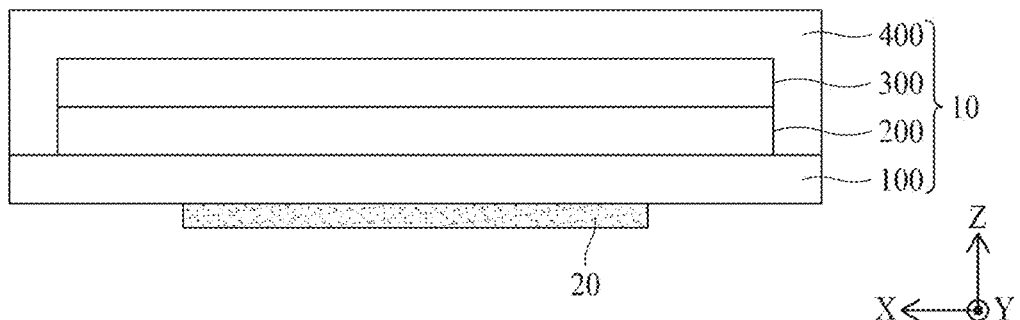
FIG. 3 is a schematic cross-sectional view of an organic light emitting display device according to an embodiment of the present disclosure. In this case, FIG. 3 corresponds to the cross-section I-I' of FIG. 1.

FIG. 3 is a schematic cross-sectional view of an organic light emitting display device according to an embodiment of the present disclosure. In this case, FIG. 3 corresponds to the cross-section I-I' of FIG. 1.

As may be seen from FIG. 3, the organic light emitting display device according to an embodiment of the present disclosure may include a display module 10 and a sensor module 20.

The display module 10 may include the substrate 100, the circuit element layer 200 provided on the substrate 100, the light emitting element layer 300 provided on the circuit element layer 200 and the encapsulation layer 400 provided on the light emitting element layer 300 and covering a portion of the upper surface of the substrate 100, the side surface of the circuit element layer 200, and the side surface of the light emitting element layer 300. Meanwhile, although not specifically shown in the FIG. 3, on the encapsulation layer 400, a color filter layer including a color filter patterned for each pixel and a black matrix surrounding the color filter or a touch panel (or a touch sensor layer) that senses a touch position may be included, or a second substrate covering the encapsulation layer 400 and collaborating to face the substrate 100 may be additionally included. The color filter layer may replace the polarizer by absorbing a part of the wavelength of light reflected from the circuit layer and the touch sensor layer, and increase the color purity of an image reproduced in the pixel array.

The sensor module 20 may be provided under the display module 10. In this case, the sensor module 20 may overlap the substrate 100, the circuit element layer 200, the light emitting element layer 300, and the encapsulation layer 400 provided in the display module 10.

Figure 4:
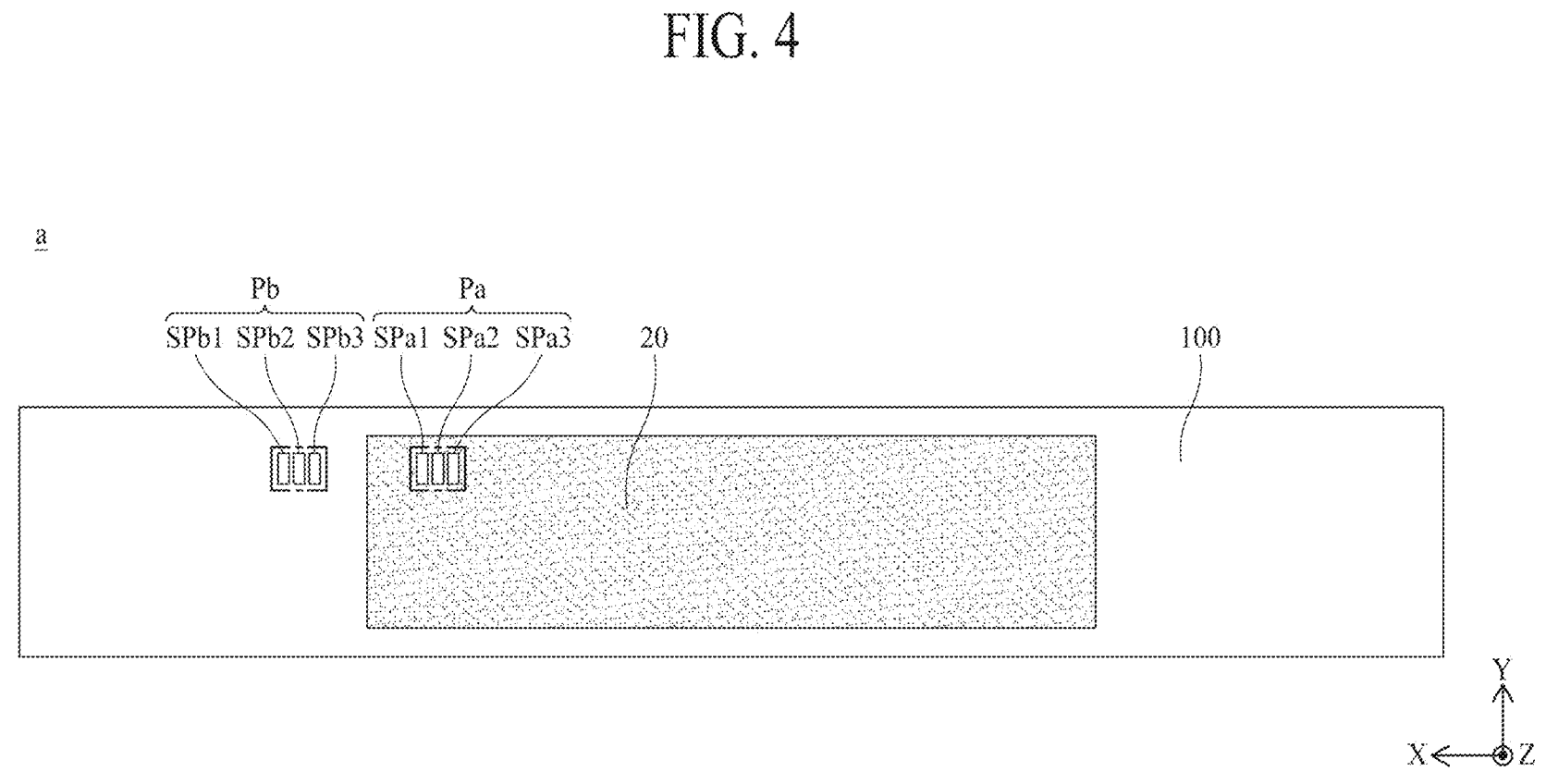

FIG. 4 is a plan view of an organic light emitting display device according to an embodiment of the present disclosure. In this case, FIG. 4 is an enlarged plan view of a region of FIG. 1.

As shown in FIG. 4, the organic light emitting display device according to an embodiment of the present disclosure may include a plurality of pixel area, such as the first pixel area Pa and the second pixel area Pb provided on the substrate 100.

As shown in FIG. 4, the first pixel area Pa may be provided in an area overlapping the sensor module 20 on the substrate 100, and the second pixel area Pb may be provided in an area not overlapping the sensor module 20 on the substrate 100, but the present disclosure is not limited thereto.

The first pixel area Pa may include a plurality of sub-pixels, such as a first sub-pixel SPa1, a second sub-pixel SPa2, and a third sub-pixel SPa3 provided in an area overlapping the sensor module 20 on the substrate 100, but the present disclosure is not limited thereto. As one example, the first sub-pixel SPa1, the second sub-pixel SPa2, and the third sub-pixel SPa3 may emit light of different colors such as red, green, and blue light, respectively. However, the present disclosure is not limited thereto, and the first pixel area Pa may include a fourth sub-pixel in addition to the first sub-pixel SPa1, the second sub-pixel SPa2, and the third sub-pixel SPa3, without being limited thereto. In this case, the fourth sub-pixel may emit white light, without being limited thereto. As an example, sub-pixels emitting light of other colors (such as, magenta, cyan, or yellow) are also possible.

Although FIG. 4 exemplarily illustrates that the first sub-pixel SPa1, the second sub-pixel SPa2, and the third sub-pixel SPa3 are arranged in a stripe shape, an embodiment of the present invention is not limited thereto. And the first sub-pixel SPa1, the second sub-pixel SPa2, and the third sub-pixel SPa3 may be arranged in various forms depending on the level of those skilled in the art. While the areas, shapes and combined shape of the first sub-pixel SPa1, the second sub-pixel SPa2, and the third sub-pixel SPa3 are shown as identical, they may actually be different from each other.

The second pixel area Pb may include a plurality of sub-pixels, such as a first sub-pixel SPb1, a second sub-pixel SPb2, and a third sub-pixel SPb3 provided in an area not overlapping the sensor module 20 on the substrate 100. The first sub-pixel SPb1, the second sub-pixel SPb2, and the third sub-pixel SPb3 may emit light of different colors such as red, green, and blue light, respectively. However, the present disclosure is not limited thereto, and the second pixel area Pb may include a fourth sub-pixel in addition to the first sub-pixel SPb1, the second sub-pixel SPb2, and the third sub-pixel SPb3. In this case, the fourth sub-pixel may emit white light, without being limited thereto. As an example, sub-pixels emitting light of other colors (such as, magenta, cyan, or yellow) are also possible.

Although FIG. 4 exemplarily illustrates that the first sub-pixel SPb1, the second sub-pixel SPb2, and the third sub-pixel SPb3 are arranged in a stripe shape, an embodiment of the present invention is not limited thereto. and the first sub-pixel SPb1, the second sub-pixel SPb2, and the third sub-pixel SPb3 may be arranged in various forms depending on the level of those skilled in the art. While the areas, shapes and combined shape of the first sub-pixel SPb1, the second sub-pixel SPb2, and the third sub-pixel SPb3 are shown as identical, they may actually be different from each other.

Figure 5:
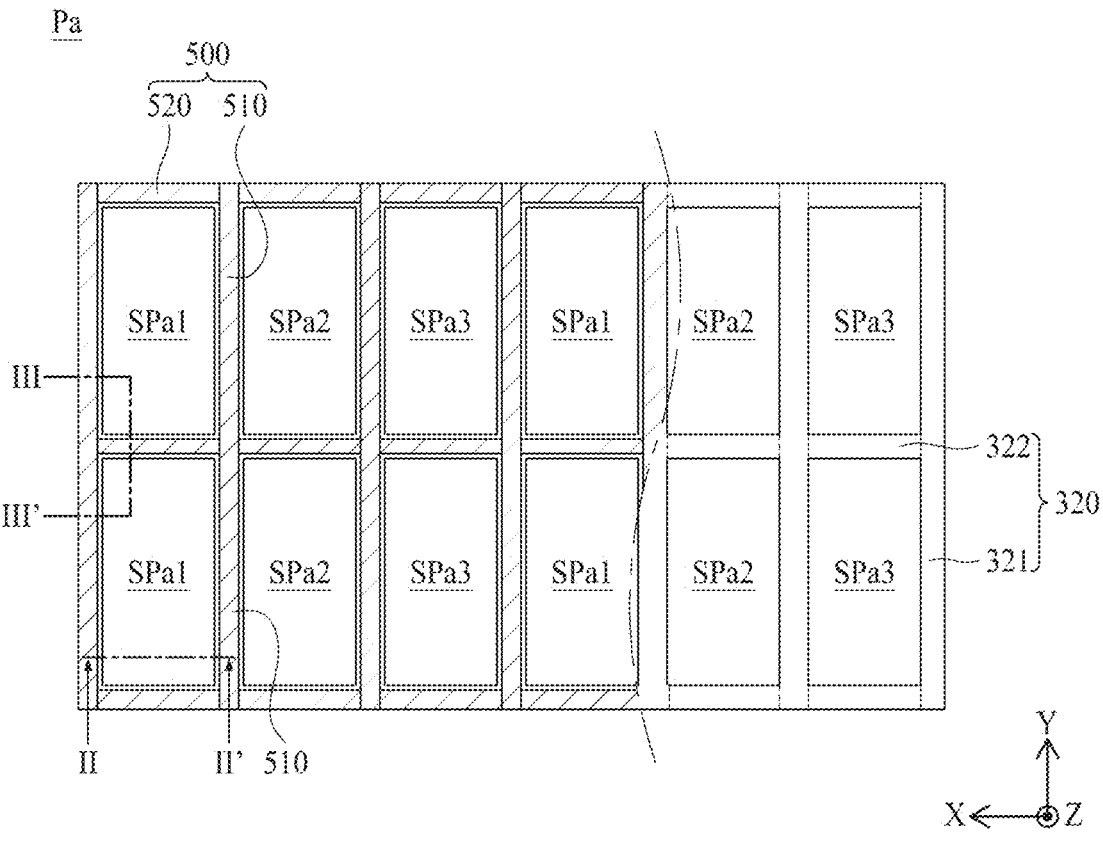
FIG. 5 is a plan view of an organic light emitting display device according to an embodiment of the present disclosure. In this case, FIG. 5 relates to the first pixel area of FIG. 4.

FIG. 5 is a plan view of an organic light emitting display device according to an embodiment of the present disclosure. In this case, FIG. 5 relates to the first pixel area of FIG. 4. In this case, a left area of FIG. 5 shows a configuration of a plurality of sub-pixels SPa1, SPa2, and SPa3 and a right area of FIG. 5 shows a plurality of sub-pixels SPa1, SPa2, and SPa3 and a bank layer 320 covering the light blocking layer 500, without being limited thereto.

As shown in FIG. 5, an organic light emitting display device according to an embodiment of the present disclosure may include a plurality of first sub-pixels SPa1, a plurality of second sub-pixels SPa2, a plurality of third sub-pixels SPa3, a bank layer 320, and a light blocking layer 500, without being limited thereto.

Each of a plurality of first sub-pixels SPa1, a plurality of second sub-pixels SPa2, and a plurality of third sub-pixels SPa3 may be arranged in a first direction X, for example, a horizontal direction and a second direction Y, for example, a vertical direction. Specifically, a plurality of first sub-pixels SPa1 are arranged along the second direction Y, and a plurality of second sub-pixels SPa2 are provided on one side of a plurality of first sub-pixels SPa1, for example, on the right side of a plurality of first sub-pixels SPa1, are arranged along the second direction Y, and a plurality of third sub-pixels SPa3 may be provided on one side of a plurality of second sub-pixels SPa2, for example, on the right side of a plurality of second sub-pixels SPa2, and may be arranged along the second direction Y. As described above, the plurality of first sub-pixels SPa1, the plurality of second sub-pixels SPa2, and the plurality of third sub-pixels SPa3 may be repeatedly formed along the first direction X.

The light blocking layer 500 may be provided between a plurality of sub-pixels SPa1, SPa2, and SPa3, and may be formed to surround any one of a plurality of sub-pixels SPa1, SPa2, and SPa3. For example, any one of a plurality of first sub-pixels SPa1, any one of a plurality of first sub-pixels SPa2, any one of a plurality of second sub-pixels SPa2, and any one of a plurality of third sub-pixels SPa3 are provided with a light blocking layer 500 at an edge thereof, and any one of a plurality of first sub-pixels SPa1, a second sub-pixel SPa2 of a plurality of second sub-pixels SPa2, and any one of a plurality of third sub-pixels SPa3 may be surrounded by the light blocking layer 500.

According to an embodiment of the present disclosure, the light blocking layer 500 may include a plurality of liquid crystal capsules (see 501, 502, and 503 in FIG. 6), and since the plurality of liquid crystal capsules (see 501, 502, and 503 in FIG. 6) respectively reflect at least one light among red (R) light, green (G) light, and blue (B) light, light emitted due to a leakage current in a region between the plurality of sub-pixels SPa1, SPa2, and SPa3 may be prevented from being directed to the outside of the display module (see 10 in FIG. 1) and more specifically to the sensor module (see 20 in FIG. 1). Meanwhile, this will be described in more detail with reference to FIG. 6.

The light blocking layer 500 may include a first light blocking layer 510 and a second light blocking layer 520. The light blocking layer 500 may be formed through inkjet printing, but is not limited thereto.

As shown in FIG. 5, the first light blocking layer 510 may be provided between a plurality of sub-pixels SPa1, SPa2, and SPa3 and extend along the second direction Y. For example, the first light blocking layer 510 may extend along the second direction Y between a plurality of first sub-pixels SPa1 and a plurality of second sub-pixels SPa2, may extend along the second direction Y between a plurality of second sub-pixels SPa2 and a plurality of third sub-pixels SPa3, or may extend along the second direction Y between a plurality of third sub-pixels SPa3 and a plurality of first sub-pixels SPa1.

As shown in FIG. 5, the second light blocking layer 520 may be provided between adjacent first sub-pixels SPa1 among the plurality of first sub-pixels SPa1, between adjacent second sub-pixels SPa2 among the plurality of second sub-pixels SPa2, or between adjacent third sub-pixels SPa3 among the plurality of third sub-pixels SPa3. For example, the second light blocking layer 520 may extend along the first direction X between adjacent first sub-pixels SPa1 among the plurality of first sub-pixels SPa1, may extend along the first direction X between adjacent second sub-pixels SPa2 among the plurality of second sub-pixels SPa2, or may extend along the first direction X between adjacent third sub-pixels SPa3 among the plurality of third sub-pixels SPa3.

According to an embodiment of the present disclosure, the first light blocking layer 510 and the second light blocking layer 520 may be continuously provided. In this case, the first light blocking layer 510 and the second light blocking layer 520 may have the same configuration. Since the first light blocking layer 510 and the second light blocking layer 520 are formed in the same process and include the same material, a process of forming the light blocking layer 500 is simplified and a manufacturing time is minimized or at least reduced.

The bank layer 320 may be provided between a plurality of sub-pixels SPa1, SPa2, and SPa3, and any one of a plurality of sub-pixels SPa1, SPa2, and SPa3 may be defined. For example, any one of a plurality of first sub-pixels SPa1 may be provided to be surrounded by the bank layer 320. The bank layer 320 serves to define a sub-pixel. Thus, the bank layer 320 may be made of an insulating material containing a black material. The bank layer 320 may be made of, for example, a transparent carbon-based mixture. Specifically, the bank layer 320 may contain carbon black, but is not limited thereto. The bank layer 320 may also be made of a transparent insulating material.

The bank layer 320 may include a first bank layer 321 extending in the second direction Y and a second bank layer 322 extending in the first direction X. The first bank layer 321 and the second bank layer 322 may be continuously provided.

The first bank layer 321 may overlap the first light blocking layer 510, and the second bank layer 322 may overlap the second light blocking layer 520, without being limited thereto. As shown in FIG. 5, in the right area of FIG. 5, the bank layer 320 covers the light blocking layer 500.

Figure 6:
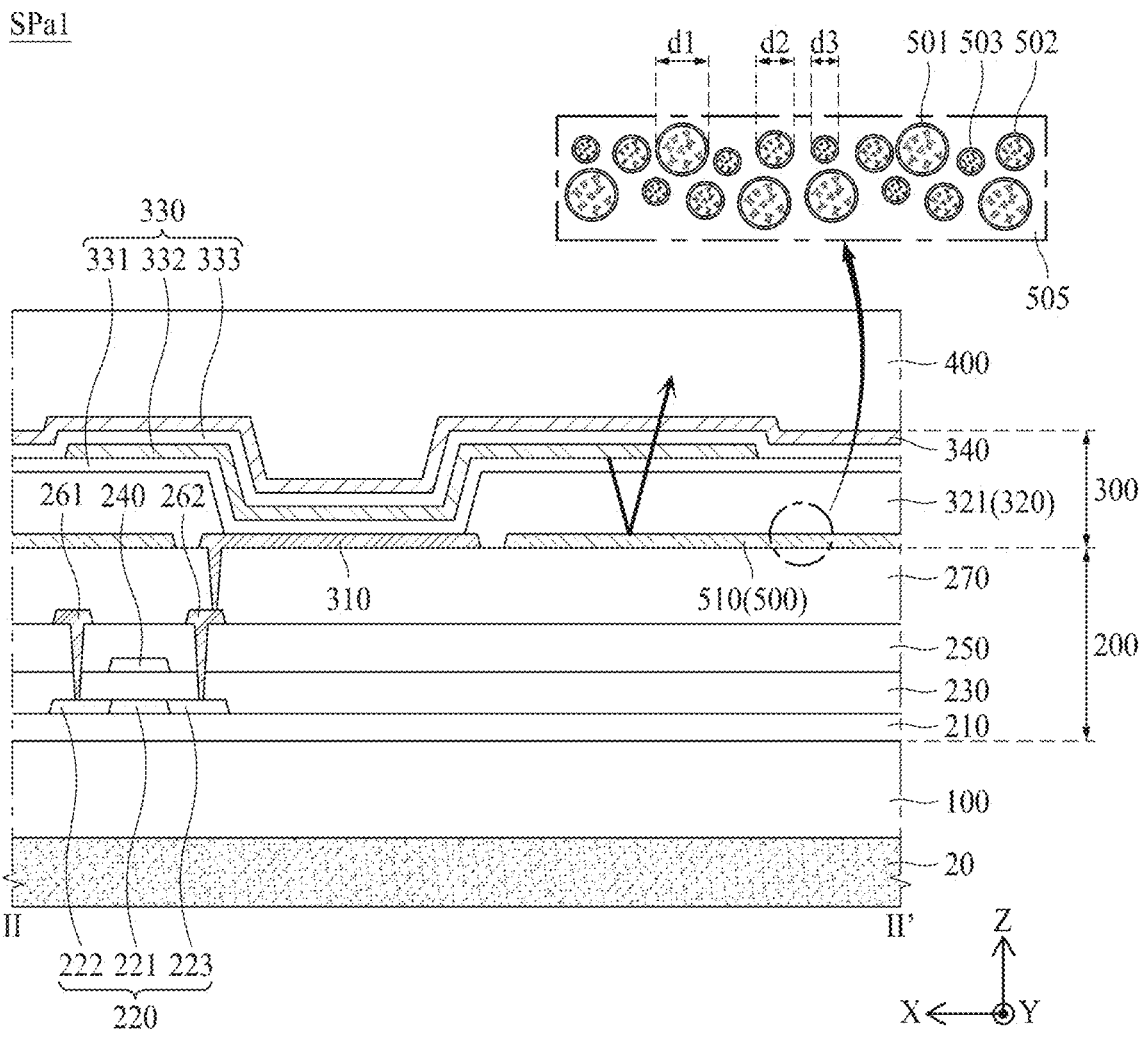
FIG. 6 is a cross-sectional view of an organic light emitting display device according to an embodiment of the present disclosure. In this case, FIG. 6 corresponds to the cross section II-II' of FIG. 5.

FIG. 6 is a cross-sectional view of an organic light emitting display device according to an embodiment of the present disclosure. In this case, FIG. 6 corresponds to the cross section II-II' of FIG. 5. Furthermore, FIG. 6 relates to a first sub-pixel SPa1 of any one of a plurality of sub-pixels SPa1, SPa2, and SPa3.

As shown in FIG. 6, an organic light emitting display device according to an embodiment of the present disclosure may include a substrate 100, a circuit element layer 200, a light emitting element layer 300, an encapsulation layer 400, a light blocking layer 500, and a sensor module 20.

The substrate 100 may be made of glass, plastic, metal foil, or any other suitable materials, without being limited thereto. The plastic substrate may be formed of a rigid or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto. In particular, the substrate 100 may be made of transparent plastic having flexible characteristics, for example, polyimide. When polyimide is used as the substrate 100, considering that a high-temperature deposition process is performed on the substrate 100, heat-resistant polyimide capable of withstanding high temperatures may be used.

The circuit element layer 200 may be formed on the substrate 100. The circuit element layer 200 may include a buffer layer 210, an active layer 220, a gate insulating layer 230, a gate electrode 240, an interlayer insulating layer 250, a source electrode 261, a drain electrode 262, and a planarization layer 270.

The buffer layer 210 may be formed on the substrate 100. The buffer layer 210 may block air and moisture to protect the active layer 220. The buffer layer 210 may be made of an inorganic insulating material such as silicon oxide, silicon nitride, or metal oxide, but is not limited thereto and may be made of an organic insulating material.

The active layer 220 may be formed on the buffer layer 210. The active layer 220 may include any one of a semiconductor material, for example, amorphous silicon, polycrystalline silicon, and an oxide semiconductor material.

For example, the oxide semiconductor material may be formed of any one of indium gallium zinc oxide (IGZO), indium zinc oxide (IZO), indium gallium tin oxide (IGTO), and indium gallium oxide (IGO), but is not limited thereto.

The active layer 220 may include a channel part 221, a first connection part 222 provided on one side of the channel part 221, for example, a left side of the channel part 221, a second connection part 223 provided on another side of the channel part 221, for example, a right side of the channel part 221, without being limited thereto.

The channel part 221 overlaps the gate electrode 240. By being formed in this way, the channel part 221 may be protected by the gate electrode 240 in the conducting process of making the active layer 220 a conductor, thereby maintaining semiconductor characteristics without becoming a conductor.

The first connection part 222 and the second connection part 223 may have conductive characteristics by a conducting process in which plasma treatment is performed on a semiconductor material using, for example, the gate electrode 240 as a mask. The first connection part 222 and the second connection part 223 by the conducting process have excellent conductive characteristics and may serve as electrodes or wirings.

The gate insulating layer 230 may be formed on the active layer 220 and the buffer layer 210. The gate insulating layer 230 may be formed on the entire surface of the substrate 100, but is not limited thereto, and a partial region of the gate insulating layer 230 may be patterned so that one end and another end of the gate insulating layer 230 correspond to one end and another end of the gate electrode 240, respectively.

The gate insulating layer 230 may include a single layer or multilayers of a silicon nitride layer SiNx or a silicon oxide layer SiOx, but is not limited thereto. The gate insulating layer 230 may be formed of a single layer or a plurality of layers including an inorganic insulating material and/or an organic insulating material.

The gate electrode 240 may be formed on the gate insulating layer 230.

The gate electrode 240 may include at least one among an aluminum-based metal such as aluminum Al or an aluminum alloy, a silver-based metal such as silver Ag or a silver alloy, a copper-based metal such as copper Cu or a copper alloy, a molybdenum-based metal such as molybdenum Mo or a molybdenum alloy, and chromium Cr, tantalum Ta, neodymium Nd, and titanium Ti, without being limited thereto. The gate electrode 240 may have a structure including one metal layer or a multilayer structure including at least two metal layers each having different physical properties, without being limited thereto.

The interlayer insulating layer 250 may be formed on the gate electrode 240 and the gate insulating layer 230. The interlayer insulating layer 250 insulates the gate electrode 240 and the source electrode 261 from each other, and further insulates the gate electrode 240 and the drain electrode 262. The interlayer insulating layer 250 may be formed of a single layer or a plurality of layers including an inorganic insulating material and/or an organic insulating material.

A contact hole may be formed in the interlayer insulating layer 250. Accordingly, a portion of the upper surface of the first connection part 222 of the active layer 220 may be exposed by any one contact hole, and furthermore, a portion of the upper surface of the second connection part 223 of the active layer 220 may be exposed by another contact hole.

The source electrode 261 and the drain electrode 262 may be disposed on the interlayer insulating layer 250.

The source electrode 261 may be electrically connected to the first connection part 222 of the active layer 220 by a contact hole, and the drain electrode 262 may be electrically connected to the second connection part 223 of the active layer 220 by a contact hole.

The source electrode 261 and the drain electrode 262 may be formed of the same material as the gate electrode 240, but are not limited thereto, and may be formed of a material according to knowledge of the art.

The planarization layer 270 may be formed on the interlayer insulating layer 250, the source electrode 261, and the drain electrode 262. The planarization layer 270 may be formed on the source electrode 261 and the drain electrode 262 to planarize the upper surface of the planarization layer 270.

A contact hole may be provided in the planarization layer 270, and a portion of the upper surface of the drain electrode 262 may be exposed by the contact hole. However, in some cases, a portion of the upper surface of the source electrode 261 may be exposed by the contact hole.

The planarization layer 270 may be formed of an organic insulating layer material. For example, the planarization layer 270 may be formed of an organic insulating material such as acrylic resin, epoxy resin, phenolic resin, polyamide resin, or polyimide resin.

The light emitting element layer 300 may be formed on the planarization layer 270. The light emitting element layer 300 may include a first electrode 310, a bank layer 320, a light emitting layer 330, and a second electrode 340, or the like. Each of the first electrode 310 and the second electrode 340 may comprise a metal material such as Au, W, Pt, Si, Ir, Ag, Cu, Ni, Ti, or Cr, and an alloy thereof. Alternatively, each of the first electrode 310 and the second electrode 340 may include a transparent conductive material such as ITO indium tin oxide or IZO indium zinc oxide.

The first electrode 310 may be formed on the planarization layer 270 and may be electrically connected to the drain electrode 162 through the contact hole provided in the planarization layer 270. The first electrode 310 may function as an anode.

The first bank layer 321 (320) may be formed on the first electrode 310. In this case, a partial region of the upper surface of the first electrode 310, which is exposed without being covered by the first bank layer 321, becomes a light emitting region.

The first bank layer 321 may be formed of an organic layer such as an acrylic resin, an epoxy resin, a phenolic resin, a polyamide resin, a polyimide resin, or the like.

The light emitting layer 330 may be formed on the first electrode 310. The light emitting layer 330 may include any suitable emission layer, such as any one of red, green, and blue emission layers patterned for each pixel, or may be formed of a white emission layer connected to all pixels, without being limited thereto. As an example, emission layers of other colors (such as, magenta, cyan, or yellow) are also possible. When the light emitting layer 330 is formed of a white emission layer, the light emitting layer 330 may include, for example, a first stack including a blue emission layer, a second stack including a yellow-green emission layer, and a charge generation layer provided between the first stack and the second stack, but is not limited thereto.

According to an embodiment of the present disclosure, the light emitting layer 330 provided in the first sub-pixel SPa1 may emit light of a first color. The light of the first color may be any one of red (R) light, green (G) light, and blue (B) light. For example, in the first sub-pixel SPa1, the light emitting layer 330 may emit light of the first color, for example, red (R) light. Meanwhile, although not illustrated, the second sub-pixel SPa2 may emit light of the second color, for example, green (G) light, and the third sub-pixel SPa3 may emit light of the second color, for example, blue (B) light, without being limited thereto.

The light emitting layer 330 may include one or more of a hole transfer layer HTL 331 provided on the first electrode 310, a first light emitting layer 1st EML 332 provided on the hole transfer layer HTL 331 and emitting light of a first color, for example, red (R) light, and an electron transfer layer ETL 333 provided on the first light emitting layer 1st EML 332. The hole transfer layer HTL 331 and the electron transfer layer ETL 333 are formed on the entire surface of the substrate 100, and the first light emitting layer 1st EML 332 may be patterned by a portion corresponding to the light emitting region of the first sub-pixel SPa1.

Specifically, the first light emitting layer 1st EML 332 may be provided on one side of the first bank layer 321, for example, a right side of the first electrode 310 or a left side of the first electrode 310, and may be provided in a partial area of an upper surface of the first bank layer 321.

Likewise, although not specifically illustrated in FIG. 6, the light emitting layer 330 provided in the second sub-pixel SPa2 may include the hole transfer layer HTL 331 provided on the first electrode 310, a second light emitting layer 2nd EML 332 provided on the hole transfer layer HTL 331 and emitting light of a second color, for example, green (G) light, and an electron transfer layer ETL 333 provided on the second light emitting layer 2nd EML 332, and the second light emitting layer 2nd EML 332 may be patterned as much as a portion corresponding to the light emitting area of the second sub-pixel SPa2. Furthermore, the light emitting layer 330 provided in the third sub-pixel SPa3 may include the hole transfer layer HTL 331 provided on the first electrode 310, a third light emitting layer 3rd EML 332 provided on the hole transfer layer HTL 331 and emitting light of a third color, for example, blue (B) light, and an electron transfer layer ETL 333 provided on the third light emitting layer 3rd EML 332, and the third light emitting layer 3rd EML 332 may be patterned as much as a portion corresponding to the light emitting area of the third sub-pixel SPa3.

In some cases, a hole injection layer HIL may be provided between the first electrode 310 and the hole transfer layer HTL 331 provided in the first sub-pixel SPa1, the second sub-pixel SPa2 and the third sub-pixel SPa3. An electron injection layer EIL may be provided between the second electrode 340 and the electron transfer layer ETL 333.

The second electrode 340 may be formed on the light emitting layer 330. The second electrode 340 may function as a cathode, without being limited thereto.

The second electrode 340 may be formed, for example, on the entire surface of the first bank layer 321 and the light emitting layer 330.

The encapsulation layer 400 may include a plurality of encapsulation layers, for example, a first encapsulation layer, a second encapsulation layer, and a third encapsulation layer, without being limited thereto. The first to third encapsulation layers may be sequentially stacked on the second electrode 340, the first encapsulation layer and the third encapsulation layer may be formed of an inorganic film layer containing an inorganic material, and the second encapsulation layer may be formed of an organic film layer containing an organic material.

The first encapsulation layer may be formed at the lowermost end of the encapsulation layer 400 and may be in contact with the upper surface of the second electrode 340. The first encapsulation layer may be formed of a material such as silicon nitride SiNx, silicon oxide SiOx, silicon oxynitride SiON, or aluminum oxide Al2O3, without being limited thereto.

The second encapsulation layer may be formed on the first encapsulation layer. The second encapsulation layer may be formed of a material such as acrylic resin, epoxy resin, polyimide, polyethylene PE, silicon oxycarbon SiOC, or the like, without being limited thereto.

The third encapsulation layer may be formed on the second encapsulation layer. The third encapsulation layer may be formed of the same material as the first encapsulation layer, without being limited thereto.

According to an embodiment of the present disclosure, the first light blocking layer 510 (500) may be formed on the planarization layer 270. In this case, the first light blocking layer 510 may be disposed under the first bank layer 321 and may be formed on the same layer as the first electrode 310.

The first light blocking layer 510 may be provided under the first bank layer 321 and may overlap the sensor module 20. The first light blocking layer 510 may reflect light emitted from an upper surface or a side surface of the bank layer 321 to emit light in a direction facing the substrate 100, thereby preventing or at least reducing light from reaching the sensor module 20.

On the first bank layer 321, specifically, a part of the first light emitting layer 1st EML 332, the hole transfer layer HTL 331, and the electron transfer layer ETL 333 may be formed. When light of a first color, for example, red (R) is emitted from the first sub-pixel SPa1, light may flow along the hole transfer layer HTL 331 or the electron transfer layer ETL 333, and light may be generated from a part of the first light emitting layer 1st EML 332 formed on a side surface of the first bank layer 321 or an upper surface of the first bank layer 321.

According to an embodiment of the present disclosure, since the light emitted by the leakage current from the first light emitting layer 1st EML 332 provided on the side or upper surface of the first bank layer 321 is reflected and blocked by the first light blocking layer 510, the light emitted by the leakage current may not reach the sensor module 20. Accordingly, according to an embodiment of the present disclosure, the first light blocking layer 510 may be provided to prevent the sensor module 20 from malfunctioning by the light emitted by the leakage current in the first light emitting layer 1st EML 332.

The first light blocking layer 510 may include a first liquid crystal capsule 501, a second liquid crystal capsule 502, a third liquid crystal capsule 503, and a base member 505. In this case, the ratio of the first liquid crystal capsule 501, the second liquid crystal capsule 502, and the third liquid crystal capsule 503 in the first light blocking layer 510 may be the same, but is not limited thereto.

The first liquid crystal capsule 501, the second liquid crystal capsule 502, and the third liquid crystal capsule 503 may include a cholesteric liquid crystal (CLC), respectively. In this case, the first liquid crystal capsule 501 may have the first size d1, the second liquid crystal capsule 502 may have the second size d2, and the third liquid crystal capsule 503 may have the third size d3. In this case, the sizes d1, d2, and d3 of each of the liquid crystal capsules 501, 502 and 503 may be defined as diameters of each of the liquid crystal capsules 501, 502 and 503.

According to an embodiment of the present disclosure, the first size d1 of the first liquid crystal capsule 501 may be greater than or equal to 150 nm and less than or equal to 175 nm, the second size d2 of the second liquid crystal capsule 502 may be greater than or equal to 125 nm and less than or equal to 165 nm, and the third size d3 of the third liquid crystal capsule 503 may be greater than or equal to 110 nm and less than or equal to 140 nm. By forming in this way, one of the first to third liquid crystal capsules may reflect a specific color of light when the first sub-pixel SPa1 emits the specific color of light, such as the first liquid crystal capsule 501 may reflect red (R) light when the first sub-pixel SPa1 emits red (R) light, for example, the second liquid crystal capsule 502 may reflect green (G) light when the first sub-pixel SPa1 emits green (G) light, for example, and the third liquid crystal capsule 503 may reflect blue (B) light when the first sub-pixel SPa1 emits blue (B) light as another example, without being limited thereto.

The base member 505 may include any one of acrylic resin, polyester resin, amino resin, vinyl resin, epoxy resin, polyimide resin, urethane resin, unsaturated polyester resin, phenol resin, polyolefin resin, silicon resin, acrylic-silicon resin, xylene resin, and ketone resin, but is not limited thereto and may include various materials according to knowledge of the art. The base member 505 may be mixed with the first liquid crystal capsule 501, the second liquid crystal capsule 502, and the third liquid crystal capsule 503 to form the first light blocking layer 510.

The sensor module 20 may be provided under the substrate 100. The sensor module 20 may detect light in an infrared wavelength band, for example, light in a wavelength range of greater than or equal to 700 nm and equal to or less than 1400 nm, and preferably, light in a wavelength range of greater than or equal to 900 nm and equal to or less than 1000 nm. The sensor module 20 may be adjusted to an on-off state by sensing light in an infrared wavelength band. For example, the sensor module 20 may be in an on state by sensing light in an infrared wavelength band emitted from a human face. In this case, the sensor module 20 may generate an electric signal by recognizing information on a human face. Also, when light in an infrared wavelength band is not detected, the sensor module 20 may be in an off state and may not recognize information on a human face.

In FIG. 6, the first sub-pixel SPa1 among the plurality of sub-pixels SPa1, SPa2, and SPa3 has been described, but the present disclosure is not limited thereto, and may be applied to other sub-pixels, such as the second sub-pixel SPa2 and the third sub-pixel SPa3, and a repeated description thereof is omitted or briefly provided.

Figure 7:
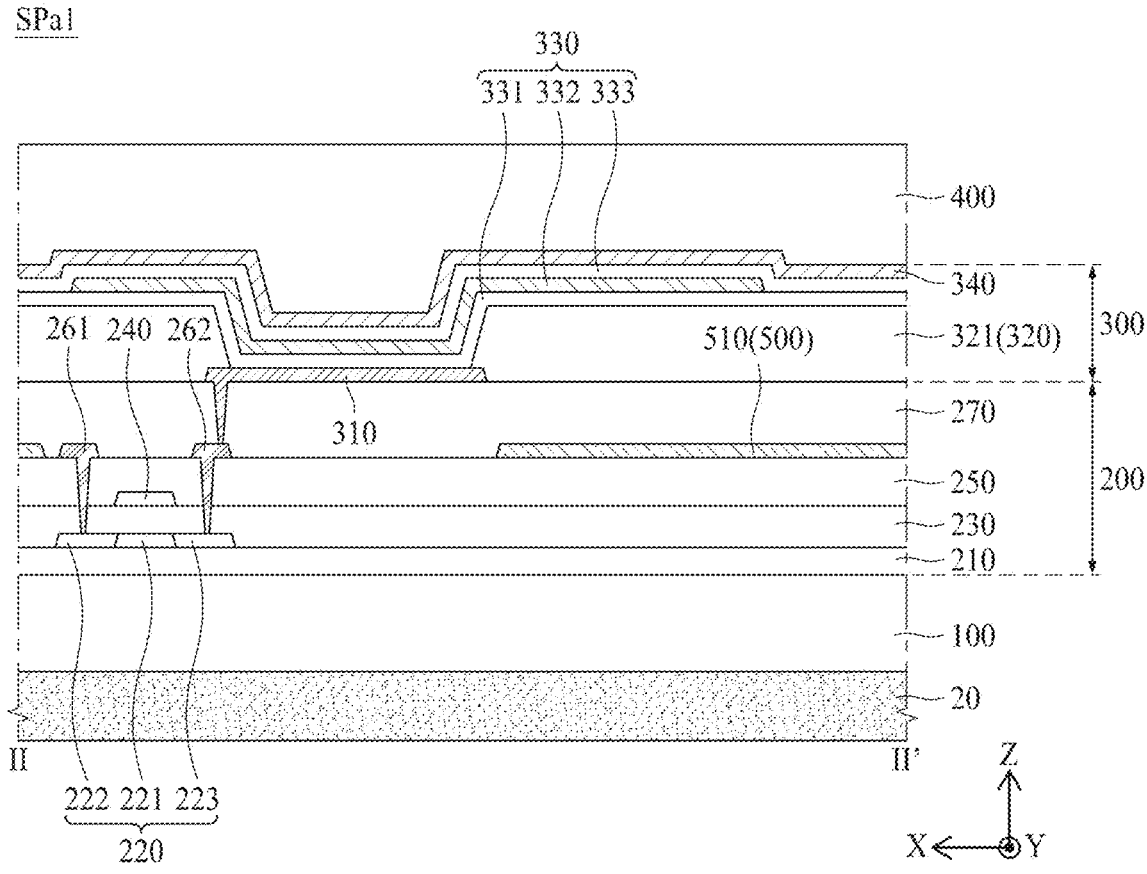
FIG. 7 is a cross-sectional view of an organic light emitting display device according to another embodiment of the present disclosure. In this case, FIG. 7 corresponds to the cross section II-II' of FIG. 5.

FIG. 7 is a cross-sectional view of an organic light emitting display device according to another embodiment of the present disclosure. In this case, FIG. 7 corresponds to the cross section II-II' of FIG. 5. Furthermore, FIG. 7 relates to a first sub-pixel SP1a of any one of a plurality of sub-pixels SPa1, SPa2, and SPa3. Meanwhile, an embodiment of FIG. 7 is the same as an embodiment of FIG. 6 except for a configuration of the first light blocking layer, and thus different configurations will be mainly described below.

As shown in FIG. 7, an organic light emitting display device according to another embodiment of the present disclosure may include a substrate 100, a circuit element layer 200, a light emitting element layer 300, an encapsulation layer 400, a light blocking layer 500, and a sensor module 20.

According to another embodiment of the present disclosure, the first light blocking layer 510 (500) may be formed on the interlayer insulating layer 250 unlike an embodiment of FIG. 6, and the first light blocking layer 510 may be disposed under the planarization layer 270.

The first light blocking layer 510 may be provided under the first bank layer 321 and may overlap the sensor module 20. The first light blocking layer 510 may reflect light emitted from an upper surface or a side surface of the bank layer 321 to emit light in a direction facing the substrate 100, thereby preventing or at least reducing light from reaching the sensor module 20.

Meanwhile, although not shown in detail, one end, for example, a left end of the first light blocking layer 510, may overlap the first electrode 310. In this case, light emitted by a leakage current from the first light emitting layer 1st EML 332 provided on a side surface or an upper surface of the first bank layer 321 may be reflected by the first light blocking layer 510 and may not be introduced into the sensor module 20.

In another embodiment of the present disclosure, only a state in which the first light blocking layer 510 is disposed between the interlayer insulating layer 250 and planarization layer 270 is illustrated, but is not limited thereto. As another example, for the first insulating layer and the second insulating layer provided on the substrate 100 and under the first bank layer 321, the first light blocking layer 510 may be provided between the first insulating layer and the second insulating layer and may overlap the first bank layer 321. For example, the first insulating layer may be any one of the buffer layer 210, the gate insulating layer 230, the interlayer insulating layer 250, and the planarization layer 270, and the second insulating layer may be any one of the gate insulating layer 230, the interlayer insulating layer 250, the planarization layer 270, and the first bank layer 321. Accordingly, the first light blocking layer 510 may be disposed between the buffer layer 210 and the gate insulating layer 230. Furthermore, the first light blocking layer 510 may be disposed between the substrate 100 and the buffer layer 210, for example. As shown in FIG. 7, the first light blocking layer 510 may be disposed between the interlayer insulating layer 250 and planarization layer 270, for example.

According to another embodiment of the present disclosure, since the light emitted by the leakage current from the first light emitting layer 1st EML 332 provided on the side or upper surface of the first bank layer 321 is reflected and blocked by the first light blocking layer 510, the light emitted by the leakage current may not reach the sensor module 20. Accordingly, according to another embodiment of the present disclosure, the first light blocking layer 510 may be provided to prevent the sensor module 20 from malfunctioning by the light emitted by the leakage current in the first light emitting layer 1st EML 332.

Figure 8:
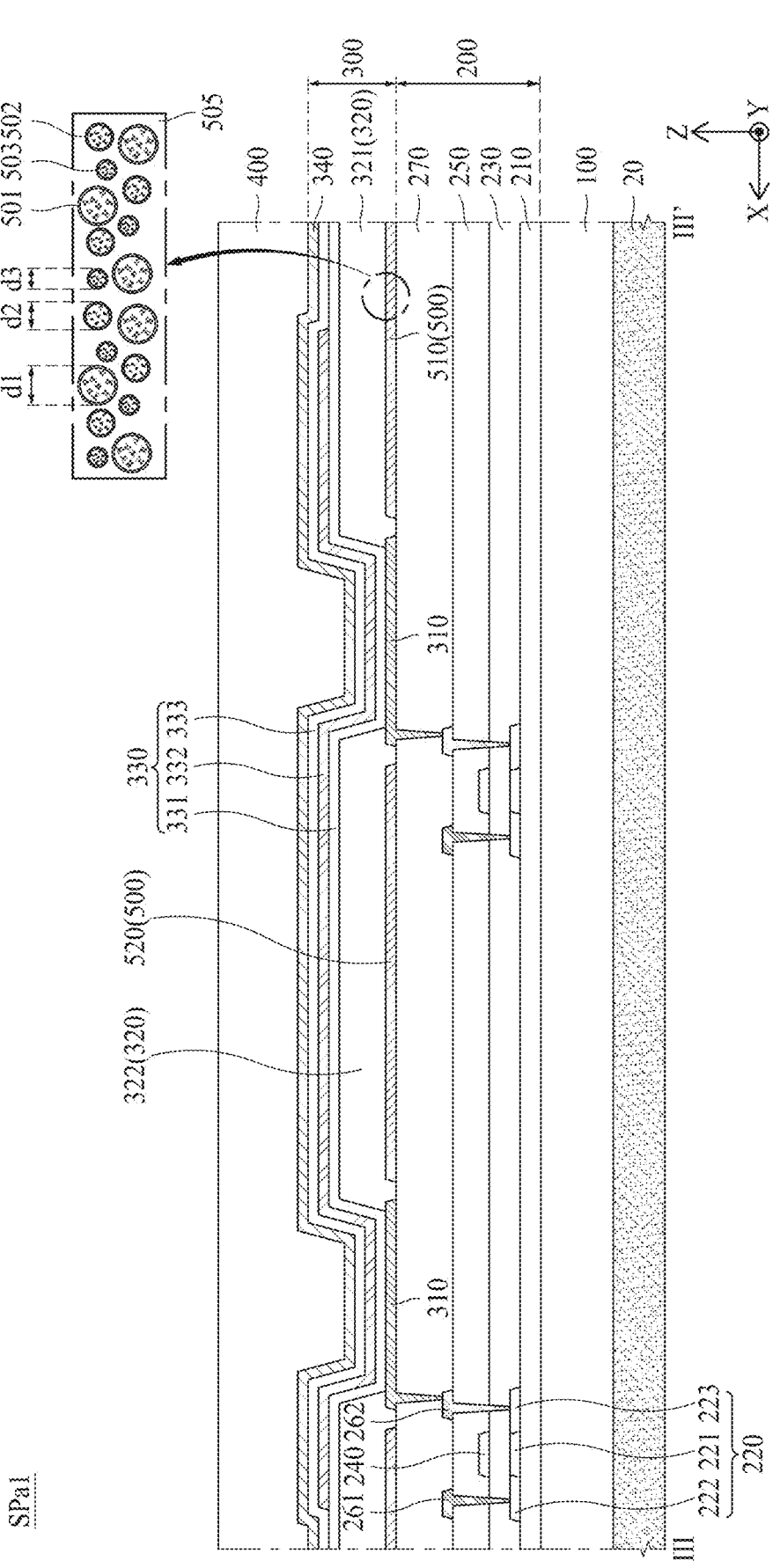
FIG. 8 is a cross-sectional view of an organic light emitting display device according to another embodiment of the present disclosure. In this case, FIG. 8 corresponds to the cross section III-III' of FIG. 5.

FIG. 8 is a cross-sectional view of an organic light emitting display device according to another embodiment of the present disclosure. In this case, FIG. 8 corresponds to the cross section III-III' of FIG. 5. FIG. 8 relates to two adjacent first sub-pixels SPa1 among a plurality of first sub-pixels SPa1. Meanwhile, since an embodiment of FIG. 8 relates to the same embodiment as an embodiment of FIG. 6, the same reference numerals are assigned to the same configuration, and different configurations will be mainly described below.

As shown in FIG. 8, an organic light emitting display device according to an embodiment of the present disclosure may include a substrate 100, a circuit element layer 200, a light emitting element layer 300, an encapsulation layer 400, a light blocking layer 500, and a sensor module 20.

The light emitting element layer 300 may include a first electrode 310, a second bank layer 322 (320), a light emitting layer 330, and a second electrode 340.

The second bank layer 322 (320) may be formed on the first electrode 310. In this case, a partial region of the upper surface of the first electrode 310, which is exposed without being covered by the second bank layer 322, becomes a light emitting region.

The second bank layer 322 may be formed of an organic layer such as an acrylic resin, an epoxy resin, a phenolic resin, a polyamide resin, a polyimide resin, or the like.

The light emitting layer 330 may be formed on the first electrode 310. The light emitting layer 330 may include any suitable emission layer, such as any one of red, green, and blue emission layers patterned for each pixel, or may be formed of a white emission layer connected to all pixels, without being limited thereto. As an example, emission layers of other colors (such as, magenta, cyan, or yellow) are also possible. When the light emitting layer 330 is formed of a white emission layer, the light emitting layer 330 may include, for example, a first stack including a blue emission layer, a second stack including a yellow-green emission layer, and a charge generation layer provided between the first stack and the second stack, but is not limited thereto.

According to an embodiment of the present disclosure, the light emitting layer 330 provided in the first sub-pixel SPa1 may emit light of a first color. The light of the first color may be any one of red (R) light, green (G) light, and blue (B) light. For example, in the first sub-pixel SPa1, the light emitting layer 330 may emit light of the first color, for example, red (R) light. Meanwhile, although not illustrated, the second sub-pixel SPa2 may emit light of the second color, for example, green (G) light, and the third sub-pixel SPa3 may emit light of the third color, for example, blue (B) light, without being limited thereto.

The light emitting layer 330 may include a hole transfer layer HTL 331 provided on the first electrode 310, a first light emitting layer 1st EML 332 provided on the hole transfer layer HTL 331 and emitting light of a first color, for example, red (R) light, and an electron transfer layer ETL 333 provided on the first light emitting layer 1st EML 332.

Specifically, the first light emitting layer 1st EML may be provided on one side of the second bank layer 322, for example, a right side of the first electrode 310 or a left side of the first electrode 310, and may be provided in a partial area of an upper surface of the second bank layer 322.

Likewise, although not specifically illustrated in FIG. 8, the light emitting layer 330 provided in a plurality of second sub-pixels SPa2 may include a hole transfer layer HTL 331 provided on the first electrode 310, a second light emitting layer 2nd EML 332 provided on the hole transfer layer HTL 331 and emitting light of a second color, for example, green (G) light, and an electron transfer layer ETL 333 provided on the second light emitting layer 2nd EML 332. Furthermore, the light emitting layer 330 provided in a plurality of third sub-pixels SPa3 may include a hole transfer layer HTL 331 provided on the first electrode 310, a third light emitting layer 3rd EML 332 provided on the hole transfer layer HTL 331 and emitting light of a third color, for example, blue (B) light, and an electron transfer layer ETL 333 provided on the third light emitting layer 3rd EML 332.

In some cases, a hole injection layer HIL may be provided between the first electrode 310 and the hole transfer layer HTL 331 provided in the first sub-pixel SPa1, the second sub-pixel SPa2 and the third sub-pixel SPa3. An electron injection layer EIL may be provided between the second electrode 340 and the electron transfer layer ETL 333.

In a plurality of first sub-pixels SPa1, the first light emitting layer 1st EML 332 may be formed on the entire surface of the hole transfer layer HTL 331. Accordingly, the first light emitting layer 1st EML 332 may be provided to entirely cover the upper surface and both side surfaces of the second bank layer 322. Meanwhile, FIG. 8 illustrates only a state in which the first light emitting layer 1st EML 332 is formed on the entire surface of the second bank layer 322 between a plurality of first sub-pixels SPa1, but the present disclosure is not limited thereto, and the first light emitting layer 1st EML 332 may be patterned in any one of a plurality of first sub-pixels SPa1 and the other first sub-pixels SPa1. In this case, the first light emitting layer 1st EML 332 may expose a part or all of the upper surface of the second bank layer 322.

According to another embodiment of the present disclosure, the second light blocking layer 520 (500) may be formed on the planarization layer 270. In this case, the second light blocking layer 520 may be provided under the second bank layer 322, and may be formed on the same layer as the first electrode 310. Meanwhile, the present disclosure is not limited thereto, and the second light blocking layer 520 may be formed, for example, between the interlayer insulating layer 250 and the planarization layer 270.

The second light blocking layer 520 may be provided under the second bank layer 322 and may overlap the sensor module 20. Light emitted from an upper surface or a side surface of the second bank layer 322 may be reflected to emit light in a direction facing the substrate 100 by the second light blocking layer 520, thereby preventing or reducing light from reaching the sensor module 20.

The light emitting layer 330 may be formed on the second bank layer 321, specifically, the first light emitting layer 1st EML 332, the hole transfer layer HTL 331, and the electron transfer layer ETL 333 described above. When light of a first color, for example, red (R) light is emitted from the first sub-pixel SPa1, as leakage current flows along the hole transport layer HTL 331 or the electron transport layer ETL 333, light may be generated from a part of the first light emitting layer 1st EML 332 formed on the side surface or the upper surface of the second bank layer 322.

According to an embodiment of the present disclosure, since the light emitted by the leakage current from the first light emitting layer 1st EML 332 provided on the side or upper surface of the second bank layer 322 is reflected and blocked by the second light blocking layer 520, the light emitted by the leakage current may not reach the sensor module 20. Accordingly, according to an embodiment of the present disclosure, the second light blocking layer 520 is provided to prevent the sensor module 20 from malfunctioning by the light emitted by the leakage current in the first light emitting layer 1st EML 332.

The second light blocking layer 520 may include a first liquid crystal capsule 501, a second liquid crystal capsule 502, a third liquid crystal capsule 503, and a base member 505.

The first liquid crystal capsule 501, the second liquid crystal capsule 502, and the third liquid crystal capsule 503 may include a cholesteric liquid crystal (CLC), respectively. In this case, the first liquid crystal capsule 501 may have the first size d1, the second liquid crystal capsule 502 may have the second size d2, and the third liquid crystal capsule 503 may have the third size d3. In this case, the sizes d1, d2, and d3 of each of the liquid crystal capsules 501, 502 and 503 may be defined as diameters of each of the liquid crystal capsules 501, 502 and 503.

According to another embodiment of the present disclosure, the first size d1 of the first liquid crystal capsule 501 may be greater than or equal to 150 nm and less than or equal to 175 nm, the second size d2 of the second liquid crystal capsule 502 may be greater than or equal to 125 nm and less than or equal to 165 nm, and the third size d3 of the third liquid crystal capsule 503 may be greater than or equal to 110 nm and less than or equal to 140 nm. By forming in this way, one of the first to third liquid crystal capsules may reflect a specific color of light when the first sub-pixel SPa1 emits the specific color of light, such as the first liquid crystal capsule 501 may reflect red (R) light when the first sub-pixel SPa1 emits red (R) light, for example, the second liquid crystal capsule 502 may reflect green (G) light when the first sub-pixel SPa1 emits green (G) light, for another example, and the third liquid crystal capsule 503 may reflect blue (B) light when the first sub-pixel SPa1 emits blue (B) light, without being limited thereto.

The base member 505 may include any one of acrylic resin, polyester resin, amino resin, vinyl resin, epoxy resin, polyimide resin, urethane resin, unsaturated polyester resin, phenol resin, polyolefin resin, silicon resin, acrylic-silicon resin, xylene resin, and ketone resin, but is not limited thereto and may include various materials according to knowledge of the art. The base member 505 may be mixed with the first liquid crystal capsule 501, the second liquid crystal capsule 502, and the third liquid crystal capsule 503 to form the second light blocking layer 520.

Meanwhile, only two adjacent first sub-pixels SPa1 among the plurality of first sub-pixels SPa1 are shown in FIG. 8, but the same may be applied to two adjacent second sub-pixels SPa2 among the plurality of second sub-pixels SPa2 and two adjacent third sub-pixels SPa3 among the plurality of third sub-pixels SPa3.

Figure 9:
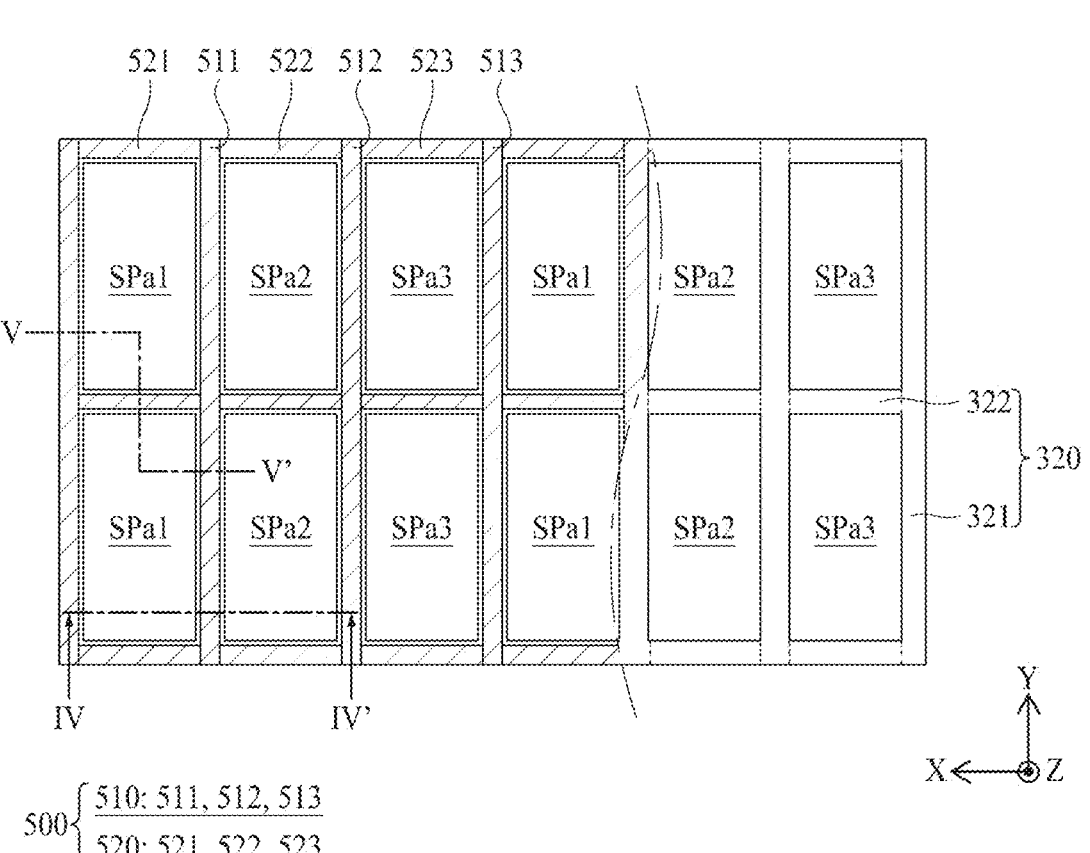
FIG. 9 is a plan view of an organic light emitting display device according to another embodiment of the present disclosure. In this case, FIG. 9 relates to the first pixel area of FIG. 4.

FIG. 9 is a plan view of an organic light emitting display device according to another embodiment of the present disclosure. In this case, FIG. 9 relates to the first pixel area of FIG. 4. In this case, a left area of FIG. 9 shows a configuration of a plurality of sub-pixels SPa1, SPa2, and SPa3 and a right area of FIG. 9 shows a plurality of sub-pixels SPa1, SPa2, and SPa3 and a bank layer 320 covering the light blocking layer 500. Meanwhile, an embodiment of FIG. 9 is the same as an embodiment of FIG. 5 except for a configuration of the light blocking layer, and thus different configurations will be mainly described below, and a repeated description thereof is omitted or briefly provided.

As shown in FIG. 9, an organic light emitting display device according to another embodiment of the present disclosure may include a plurality of first sub-pixels SPa1, a plurality of second sub-pixels SPa2, a plurality of third sub-pixels SPa3, a bank layer 320, and a light blocking layer 500, without being limited thereto.

The light blocking layer 500 may be provided between a plurality of sub-pixels SPa1, SPa2, and SPa3, and may be formed to surround any one of a plurality of sub-pixels SPa1, SPa2, and SPa3. For example, any one of a plurality of first sub-pixels SPa1, any one of a plurality of second sub-pixels SPa2, and any one of a plurality of third sub-pixels SPa3 are provided with a light blocking layer 500 at an edge thereof, and any one of a plurality of first sub-pixels SPa1, a second sub-pixel SPa2 of a plurality of second sub-pixels SPa2, and any one of a plurality of third sub-pixels SPa3 may be surrounded by the light blocking layer 500.

According to another embodiment of the present disclosure, the light blocking layer 500 may include a plurality of liquid crystal capsules (see 501, 502, and 503 in FIG. 10), and since the plurality of liquid crystal capsules (see 501, 502, and 503 in FIG. 10) respectively reflect at least one light among red (R) light, green (G) light, and blue (B) light, light emitted due to a leakage current in a region between the plurality of sub-pixels SPa1, SPa2, and SPa3 may be prevented from specifically directed to the sensor module (see 20 in FIG. 1) through the plurality of sub-pixels SPa1, SPa2, and SPa3. Meanwhile, this will be described in more detail with reference to FIG. 10.

As shown in FIG. 9, the light blocking layer 500 may include a first light blocking layer 510 and a second light blocking layer 520. The light blocking layer 500 may be formed through inkjet printing, but is not limited thereto.

The first light blocking layer 510 may be provided between a plurality of sub-pixels SPa1, SPa2, and SPa3 and extend along the second direction Y. The first light blocking layer 510 may include a 1-1 light blocking layer 511 provided between a plurality of first sub-pixels SPa1 and a plurality of second sub-pixels SPa2 and extending in the second direction Y, a 1-2 light blocking layer 512 provided between a plurality of second sub-pixels SPa2 and a plurality of third sub-pixels SPa3 and a 1-3 light blocking layer 513 provided between a plurality of third sub-pixels SPa3 and a plurality of first sub-pixels SPa1 and extending in the second direction Y.

According to another embodiment of the present disclosure, the 1-1 light blocking layer 511, the 1-2 light blocking layer 512, and the 1-3 light blocking layer 513 may include a plurality of liquid crystal capsules (see 501, 502 and 503 of FIG. 10) having different sizes. In this case, since the compositions of a plurality of liquid crystal capsules (see 501, 502 and 503 of FIG. 10) included in the 1-1 light blocking layer 511, the 1-2 light blocking layer 512, and the 1-3 light blocking layer 513 are formed differently, the probability that the light emitted by the leakage current between a plurality of first sub-pixels SPa1, a plurality of second sub-pixels SPa2, and a plurality of third sub-pixels SPa3 may be reflected by the 1-1 light blocking layer 511, the 1-2 light blocking layer 512, and the 1-3 light blocking layer 513 may increase. Meanwhile, this will be described in more detail in FIG. 10.

The second light blocking layer 520 may be provided between adjacent first sub-pixels SPa1 among the plurality of first sub-pixels SPa1, between adjacent second sub-pixels SPa2 among the plurality of second sub-pixels SPa2, or between adjacent third sub-pixels SPa3 among the plurality of third sub-pixels SPa3. The second light blocking layer 520 may include a 2-1 light blocking layer 521, a 2-2 light blocking layer 522, and a 2-3 light blocking layer 523. In this case, the 2-1 light blocking layer 521 may be provided between adjacent first sub-pixels SPa1 among a plurality of first sub-pixels SPa1, and the 2-2 light blocking layer 522 may be provided between adjacent second sub-pixels SPa2 among a plurality of second sub-pixels SPa2, and the 2-3 light blocking layer 523 may be provided between adjacent third sub-pixels SPa3 among a plurality of third sub-pixels SPa3.

For a more specific example, the 2-1 light blocking layer 521 may extend along the first direction X between adjacent first sub-pixels SPa1 among a plurality of first sub-pixels SPa1, and the 2-2 light blocking layer 522 may extend along the first direction X between adjacent second sub-pixels SPa2 among a plurality of second sub-pixels SPa2, and the 2-3 light blocking layer 523 may extend along the first direction X between adjacent third sub-pixels SPa3 among a plurality of third sub-pixels SPa3.

According to another embodiment of the present disclosure, the second light blocking layer 520 may have a different configuration from that of the first light blocking layer 510. For example, the first light blocking layer 510 may include at least two or more liquid crystal capsules that block light emitted from adjacent sub-pixels emitting light of different colors, and the second light blocking layer 520 may include at least one or more liquid crystal capsules that block light emitted from adjacent sub-pixels emitting light of the same color. For a more specific example, the 1-1 light blocking layer 511 provided between the plurality of first sub-pixels SPa1 and the plurality of second sub-pixels SPa2 may include at least two liquid crystal capsules to block light emitted from each of the first sub-pixel SPa1 and the second sub-pixel SPa2, and the 2-1 light blocking layer 521 provided between the plurality of adjacent first sub-pixels SPa1 may include at least one liquid crystal capsule to block light emitted from the first sub-pixel SPa1.

According to another embodiment of the present disclosure, the 2-1 light blocking layer 521, the 2-2 light blocking layer 522, and the 2-3 light blocking layer 523 may include a plurality of liquid crystal capsules (see 501, 502 and 503 of FIG. 10) having different sizes. In this case, since the compositions of a plurality of liquid crystal capsules (see 501, 502 and 503 of FIG. 10) included in the 2-1 light blocking layer 521, the 2-2 light blocking layer 522 and the 2-3 light blocking layer 523 are differently formed, the probability that light emitted by a leakage current between a plurality of first sub-pixels SPa1, a plurality of second sub-pixels SPa2, and a plurality of third sub-pixels SPa3 may be reflected by the 2-1 light blocking layer 521, the 2-2 light blocking layer 522, and the 2-3 light blocking layer 523 may increase. Meanwhile, this will be described in more detail in FIG. 10.

Figure 10:
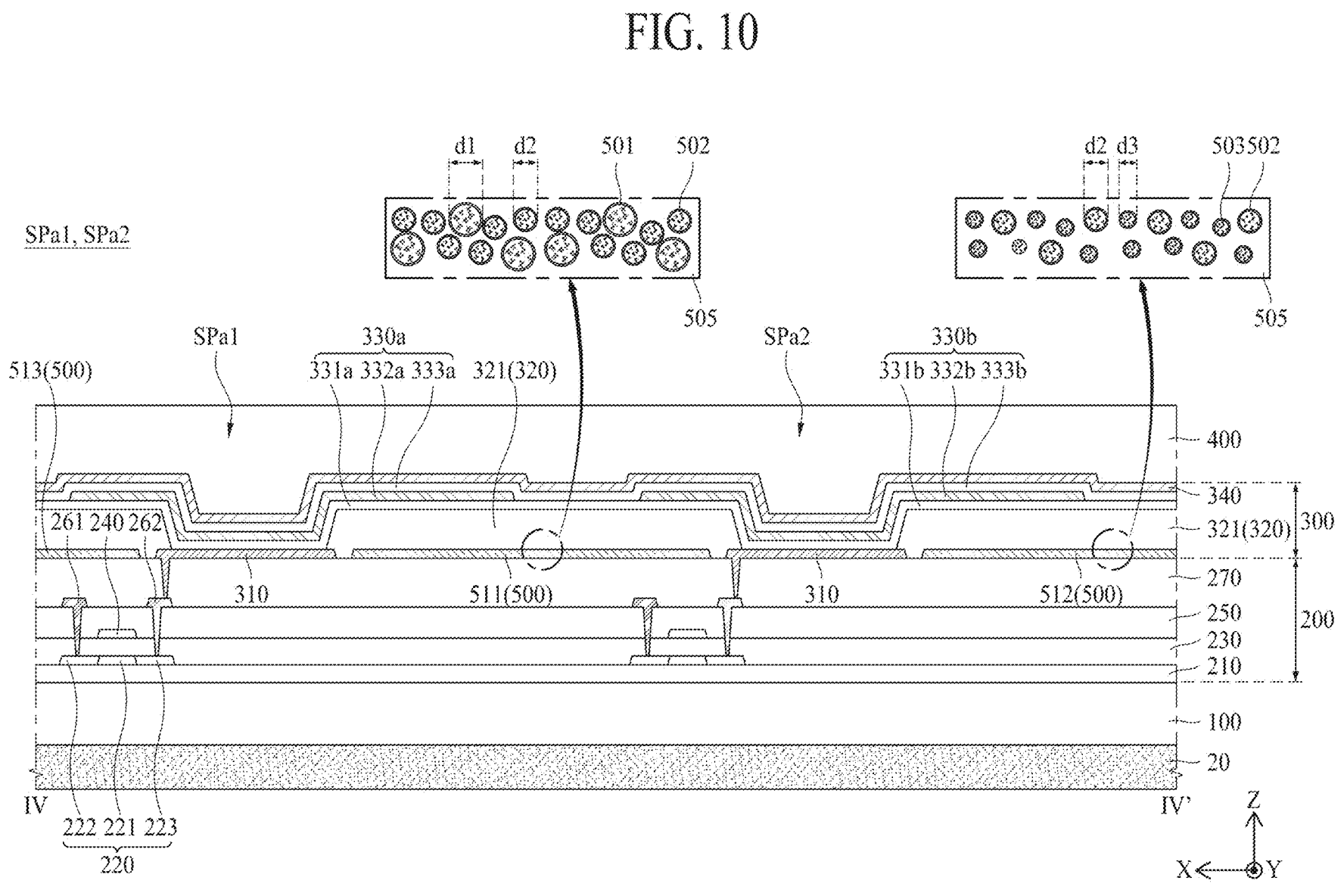

FIG. 10 is a cross-sectional view of an organic light emitting display device according to another embodiment of the present disclosure. In this case, FIG. 10 corresponds to the cross section IV-IV' of FIG. 9. Furthermore, FIG. 10 is a cross-sectional view of any one of the first sub-pixels SPa1 and any one of the second sub-pixels SPa2 among a plurality of sub-pixels SPa1, SPa2, and SPa3, but an embodiment of FIG. 10 may also be applied to the second sub-pixel SPa2 and the third sub-pixel SPa3. Meanwhile, an embodiment of FIG. 10 is the same as an embodiment of FIG. 6 except for a configuration of the first light blocking layer, and thus different configurations will be mainly described below.

As shown in FIG. 10, an organic light emitting display device according to another embodiment of the present disclosure may include a substrate 100, a circuit element layer 200, a light emitting element layer 300, an encapsulation layer 400, a light blocking layer 500, and a sensor module 20.

The light emitting element layer 300 provided in the first sub-pixel SP1a of any one of the plurality of first sub-pixels SPa1 may include a first electrode 310, a first bank layer 321 (320), a light emitting layer 330a, and a second electrode 340, and the light emitting element layer 300 provided in the second sub-pixel SP2a of any one of the plurality of second sub-pixels SPa2 may include a first electrode 310, a first bank layer 321 (320), a light emitting layer 330b, and a second electrode 340.

According to another embodiment of the present disclosure, the light emitting layer 330a provided in the first sub-pixel SPa1 may include a hole transfer layer HTL 331a provided on the first electrode 310, a first light emitting layer 1st EML 332a provided on the hole transfer layer HTL 331a and emitting a first color, for example, red (R), and an electron transfer layer ETL 333*a* provided on the first light emitting layer 1st EML 332*a*. The hole transfer layer HTL 331*a* and the electron transfer layer ETL 333*a* may be formed on the entire surface of the substrate 100, and the first light emitting layer 1st EML 332*a* may be patterned by a portion corresponding to the light emitting region of the first sub-pixel SPa1.

Furthermore, the light emitting layer 330*b* provided in the second sub-pixel SPa2 may include a hole transfer layer HTL 331*b* provided on the first electrode 310, a second light emitting layer 2nd EML 332*b* provided on the hole transfer layer HTL 331*b* and emitting a second color, for example, green (G), and an electron transfer layer ETL 333*b* provided on the second light emitting layer 2nd EML 332*b*. The hole transfer layer HTL 331*b* and the electron transfer layer ETL 333*b* may be formed on the entire surface of the substrate 100, and the second light emitting layer 2nd EML 332*b* may be patterned by a portion corresponding to the light emitting region of the second sub-pixel SPa2.

Meanwhile, FIG. 10 illustrates only a state in which the first light emitting layer 1st EML 332*a* provided in the first sub-pixel SPa1 and the second light emitting layer 2nd EML 332*b* provided in the second sub-pixel SPa2 are spaced apart from the upper surface of the first bank layer 321, but the present disclosure is not limited thereto, and the first light emitting layer 1st EML 332*a* and the second light emitting layer 2nd EML 332*b* may partially overlap each other on the upper surface of the first bank layer 321. For example, the second light emitting layer 2nd EML 332*b* may be provided on the first light emitting layer 1st EML 332*a*, or the first light emitting layer 1st EML 332*a* may be provided on the second light emitting layer 2nd EML 332*b*.

A 1-1 light blocking layer 511 (500) may be provided between the first sub-pixel SPa1 and the second sub-pixel SPa2. The 1-1 light blocking layer 511 may reflect light of a first color emitted from the first sub-pixel SPa1 and/or light of a second color emitted from the second sub-pixel SPa2.

According to another embodiment of the present disclosure, since the light emitted by the leakage current from the first light emitting layer 1st EML 332*a* and/or the second light emitting layer 2nd EML 332*b* provided on the side or upper surface of the first bank layer 321 is reflected and blocked by the 1-1 light blocking layer 511, the light emitted by the leakage current, for example, the light of the first color and/or the second color may not reach the sensor module 20. Accordingly, according to an embodiment of the present disclosure, the first light blocking layer 510 is provided to prevent the sensor module 20 from malfunctioning by the light emitted by the leakage current in the first light emitting layer 1st EML 332*a* and/or the second light emitting layer 2nd EML 332*b*.

The 1-1 light blocking layer 511 may include a first liquid crystal capsule 501, a second liquid crystal capsule 502, and a base member 505. In this case, the ratio of the first liquid crystal capsule 501 and the second liquid crystal capsule 502 in the 1-1 light blocking layer 511 may be the same, but is not limited thereto.

The first liquid crystal capsule 501 and the second liquid crystal capsule 502 may include a cholesteric liquid crystal (CLC), respectively. In this case, the first liquid crystal capsule 501 may have the first size d1, and the second liquid crystal capsule 502 may have the second size d2. In this case, the sizes d1 and d2 of each of the liquid crystal capsules 501 and 502 may be defined as diameters of the liquid crystal capsules 501 and 502.

According to another embodiment of the present disclosure, the first size d1 of the first liquid crystal capsule 501 may be greater than or equal to 150 nm and less than or equal to 175 nm, and the second size d2 of the second liquid crystal capsule 502 may be greater than or equal to 125 nm and less than or equal to 165 nm. By forming in this way, one of the first to second liquid crystal capsules may reflect a specific color of light when the first sub-pixel SPa1 emits the specific color of light, such as the first liquid crystal capsule 501 may reflect red (R) light when the first sub-pixel SPa1 emits red (R) light, for example, the second liquid crystal capsule 502 may reflect green (G) light when the first sub-pixel SPa1 emits green (G) light, for another example.

The base member 505 may be mixed with the first liquid crystal capsule 501 and the second liquid crystal capsule 502 to form a 1-1 light blocking layer 511.

According to another embodiment of the present disclosure, as a 1-1 light blocking layer 511 including a first liquid crystal capsule 501 that blocks light of a first color, for example, red (R) light and a second liquid crystal capsule 502 that blocks light of a second color, for example, green (G) is provided between the first sub-pixel SPa1 that emits the light of the first color, for example, red (R) light and the second sub-pixel SPa2 that emits the light of the second color, for example, green (G) light, light emitted by a leakage current generated between the first sub-pixel SPa1 and the second sub-pixel SPa2 may be blocked to be introduced in the sensor module 20.

According to another embodiment of the present disclosure, a 1-2 light blocking layer 512 (500) may be provided below the first bank layer 321 provided between the second sub-pixel SPa2 and the third sub-pixel SPa3 (see SPa3 of FIG. 9). The 1-2 light blocking layer 512 (500) may include a second liquid crystal capsule 502, a third liquid crystal capsule 503, and a base member 505. In this case, in the 1-2 light blocking layer 512, the ratio of the second liquid crystal capsule 502 and the third liquid crystal capsule 503 may be the same, but is not limited thereto.

The second liquid crystal capsule 502 and the third liquid crystal capsule 503 may include a cholesteric liquid crystal (CLC), respectively. In this case, the second liquid crystal capsule 502 may have the second size d2, and the third liquid crystal capsule 503 may have the third size d3. In this case, the sizes d2 and d3 of each of the liquid crystal capsules 502 and 503 may be defined as diameters of the liquid crystal capsules 502 and 503.

According to another embodiment of the present disclosure, the second size d2 of the second liquid crystal capsule 502 may be greater than or equal to 125 nm and less than or equal to 165 nm, and the third size d3 of the third liquid crystal capsule 503 may be greater than or equal to 110 nm and less than or equal to 140 nm. By forming in this way, the second liquid crystal capsule 502 may reflect green (G) light when the second sub-pixel SPa2 emits green (G) light, for example, and the third liquid crystal capsule 503 may reflect blue (B) light when the third sub-pixel (see SPa3 in FIG. 9) emits blue (B) light as another example.

The base member 505 may be mixed with the second liquid crystal capsule 502 and the third liquid crystal capsule 503 to form the 1-2 light blocking layer 512.

According to another embodiment of the present disclosure, as a 2-2 light blocking layer 522 including a second liquid crystal capsule 502 that blocks light of a second color, for example, green (G) light and a third liquid crystal capsule 503 that blocks light of a third color, for example, blue (B) light is provided between the second sub-pixel SPa2 that emits the light of the second color, for example, green (G) light and the third sub-pixel SPa3 that emits the light of the third color, for example, blue (B) light, light emitted by a leakage current generated between the second sub-pixel SPa2 and the third sub-pixel SPa3 may be blocked to be introduced in the sensor module 20.

Meanwhile, although not illustrated in detail, a 1-3 light blocking layer 513 (500) may be provided below the first bank layer 321 between the first sub-pixel SPa1 and the third sub-pixel (see SPa3 of FIG. 9), and the 1-3 light blocking layer 513 may include a first liquid crystal capsule 501, a third liquid crystal capsule 503, and a base member 505. By forming in this way, the light emitted by the leakage current between the first sub-pixel SPa1 and the third sub-pixel (see SPa3 of FIG. 9) is reflected by the 1-3 light blocking layer 513 to prevent the sensor module 20 from malfunctioning.

Figure 11:
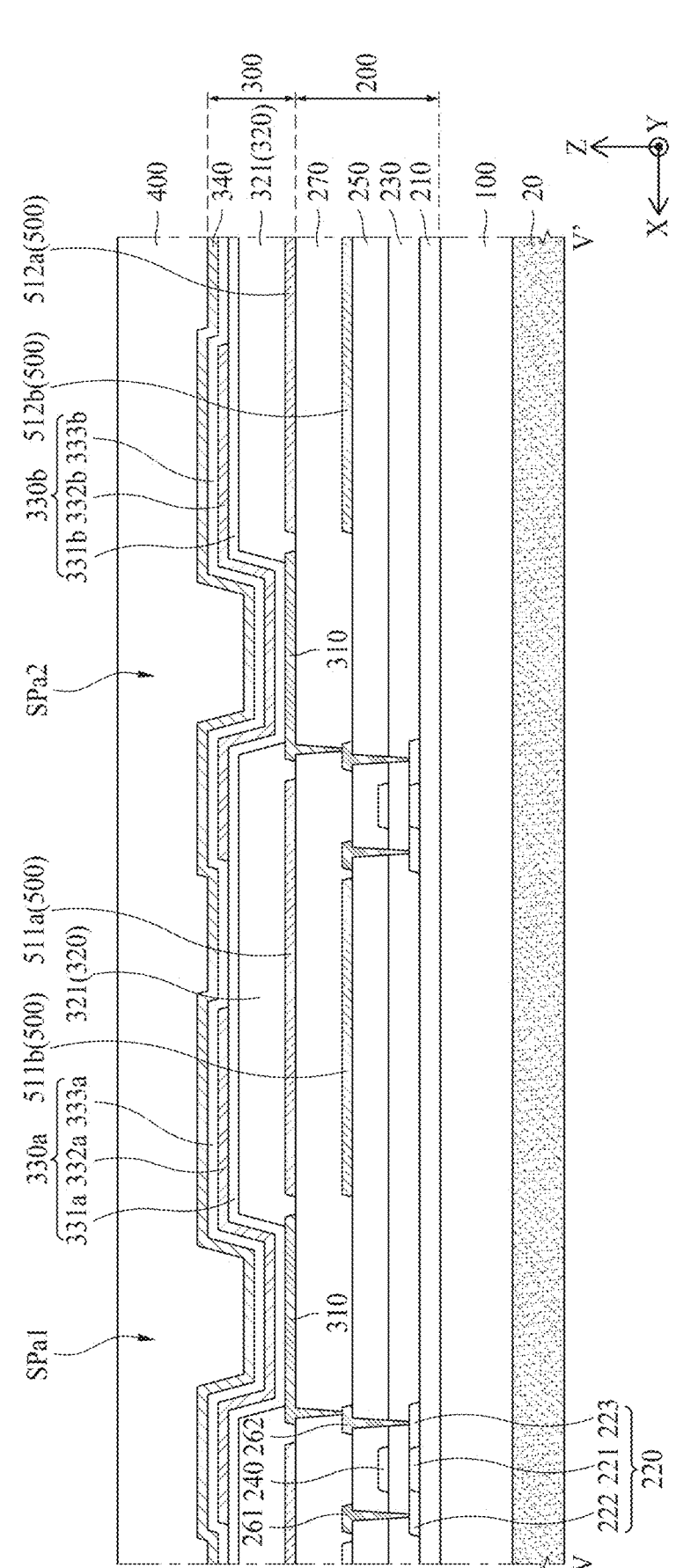
FIG. 11 is a cross-sectional view of an organic light emitting display device according to another embodiment of the present disclosure. In this case, FIG. 11 corresponds to the cross section IV-IV' of FIG. 9.

FIG. 11 is a cross-sectional view of an organic light emitting display device according to another embodiment of the present disclosure. In this case, FIG. 11 corresponds to the cross section IV-IV' of FIG. 9. Further, FIG. 11 is a cross-sectional view of any one of the first sub-pixels SPa1 and any one of second sub-pixel SPa2 of the plurality of sub-pixels SPa1, SPa2, and SPa3, but an embodiment of FIG. 11 may be applied to the second sub-pixel SPa2 and the third sub-pixel SPa3. Meanwhile, an embodiment of FIG. 11 is the same as an embodiment of FIG. 10 except for a configuration of the first light blocking layer, and thus different configurations will be mainly described below.

As shown in FIG. 11, an organic light emitting display device according to another embodiment of the present disclosure may include a substrate 100, a circuit element layer 200, a light emitting element layer 300, an encapsulation layer 400, a light blocking layer 500, and a sensor module 20.

The light emitting element layer 300 provided in the first sub-pixel SP1a of any one of the plurality of first sub-pixels SPa1 may include a first electrode 310, a first bank layer 321 (320), a light emitting layer 330a, and a second electrode 340, and the light emitting element layer 300 provided in the second sub-pixel SP2a of any one of the plurality of second sub-pixels SPa2 may include a first electrode 310, a first bank layer 321 (320), a light emitting layer 330b, and a second electrode 340.

A 1-1 light blocking layer 511 (500) may be provided between the first sub-pixel SPa1 and the second sub-pixel SPa2. The 1-1 light blocking layer 511 may reflect light of a first color emitted from the first sub-pixel SPa1 and/or light of a second color emitted from the second sub-pixel SPa2.

The 1-1 light blocking layer 511 may include an upper 1-1 light blocking layer 511a and a lower 1-1 light blocking layer 511b. The upper 1-1 light blocking layer 511a and the lower 1-1 light blocking layer 511b may overlap each other. Meanwhile, in FIG. 11, a length of the upper 1-1 light blocking layer 511a in the first direction X is provided to be greater than a length of the lower 1-1 light blocking layer 511b in the first direction X, but the present disclosure is not limited thereto, and the upper 1-1 light blocking layer 511a and the lower 1-1 light blocking layer 511b may have different lengths in the first direction X according to knowledge of those skilled in the art. Furthermore, the upper 1-1 light blocking layer 511a and the lower 1-1 light blocking layer 511b may have the same thickness or different thicknesses. In this case, the thickness may be defined as a length in the third direction Z.

The upper 1-1 light blocking layer 511a may be provided, for example, on the planarization layer 270, under the first bank layer 321, and the lower 1-1 light blocking layer 511b may be provided, for example, on the interlayer insulating layer 250, and under the planarization layer 270, but is not limited thereto. Meanwhile, although not illustrated in detail, the lower 1-1 light blocking layer 511b may be provided to extend in the first direction X, for example, to the left, to overlap a portion of the first electrode 310 formed in the first sub-pixel SPa1.

According to another embodiment of the present disclosure, the upper 1-1 light blocking layer 511a may reflect any one of light of a first color emitted from the first sub-pixel SPa1 and light of a second color emitted from the second sub-pixel SPa2, and the lower 1-1 light blocking layer 511b may reflect another one of light of a first color emitted from the first sub-pixel SPa1 and light of a second color emitted from the second sub-pixel SPa2. For example, when light of a first color emitted from the first sub-pixel SPa1 is red (R) light and light of a second color emitted from the second sub-pixel SPa2 is green (G) light, the upper 1-1 light blocking layer 511a may reflect light of red (R) and the light of green (G), and the lower 1-1 light blocking layer 511b may reflect another one of the light of red (R) and the light of green (G). In some cases, the upper 1-1 light blocking layer 511a may reflect light of red (R), and the lower 1-1 light blocking layer 511b may reflect light of green (G). In some cases, the upper 1-1 light blocking layer 511a may reflect light of green (G), and the lower 1-1 light blocking layer 511b may reflect light of red (R), without being limited thereto. As an example, light of other colors (such as, magenta, cyan, or yellow) are also possible.

According to another embodiment of the present disclosure, since the light emitted by the leakage current from the first light emitting layer 1st EML 332a and/or the second light emitting layer 2nd EML 332b provided on the side or upper surface of the first bank layer 321 is reflected and blocked by the upper 1-1 light blocking layer 511a and the lower 1-1 light blocking layer 511b, the light emitted by the leakage current may not reach the sensor module 20. Accordingly, according to an embodiment of the present disclosure, the first light blocking layer 510 may prevent the sensor module 20 from malfunctioning by the light emitted by the leakage current in the first light emitting layer 1st EML 332a and/or the second light emitting layer 2nd EML 332b.

Each of the upper 1-1 light blocking layer 511a and the lower 1-1 light blocking layer 511b may include any one of first to third liquid crystal capsules (see 501, 502 and 503 in FIG. 10). For example, the upper 1-1 light blocking layer 511a may include a first liquid crystal capsule (see 501 in FIG. 10) of a first size (see d1 in FIG. 10), and the lower 1-1 light blocking layer 511b may include a second liquid crystal capsule (see 502 in FIG. 10) of a second size (see d2 in FIG. 10). By forming in this way, light emitted from the first light emitting layer 1st EML 322a and/or the second light emitting layer 2nd EML 332b by leakage current may be reflected by the upper 1-1 light blocking layer 511a and the lower 1-1 light blocking layer 511b to be blocked.

A 1-2 light blocking layer 512 (500) may be provided below the first bank layer 321 provided between the second sub-pixel SPa2 and the third sub-pixel (see SPa3 of FIG. 9).

The 1-2 light blocking layer 512 may include an upper 1-2 light blocking layer 512a and a lower 1-2 light blocking layer 512b. The 1-2 light blocking layer 512a and the lower 1-2 light blocking layer 512b may overlap each other. Meanwhile, in FIG. 11, the length of the upper 1-2 light blocking layer 512a in the first direction X is greater than the length of the lower 1-2 light blocking layer 512b in the first direction X, but the present disclosure is not limited thereto, and the lengths of the upper 1-2 light blocking layer 512a and the lower 1-2 light blocking layer 512b in the first direction X may be formed to be different according to knowledge of those skilled in the art. Also, the upper 1-2 light blocking layer 512*a* and the lower 1-2 light blocking layer 512*b* may have the same thickness or different thicknesses. In this case, the thickness may be defined as a length in the third direction Z.

The upper 1-2 light blocking layer 512*a* may be provided, for example, on the planarization layer 270, under the first bank layer 321, and the lower 1-2 light blocking layer 512*b* may be provided, for example, on the interlayer insulating layer 250 and under the planarization layer 270, but is not limited thereto. Meanwhile, although not illustrated in detail, the lower 1-2 light blocking layer 512*b* may be provided to extend in the first direction X, for example, to the left, to overlap a portion of the first electrode 310 formed in the second sub-pixel SPa2.

According to another embodiment of the present disclosure, the upper 1-2 light blocking layer 512*a* may reflect any one of light of a second color emitted from the second sub-pixel SPa2 and light of a third color emitted from the third sub-pixel SPa3, and the lower 1-2 light blocking layer 512*b* may reflect another one of light of a second color emitted from the second sub-pixel SPa2 and light of a third color emitted from the third sub-pixel SPa3. For example, when light of the second color emitted from the second sub-pixel SPa2 is green (G) light and light of the third color emitted from the third sub-pixel SPa3 is blue (B) light, the upper 1-2 light blocking layer 512*a* may reflect light of green (G), and the lower 1-2 light blocking layer 512*b* may reflect light of blue (B). In some cases, the upper 1-2 light blocking layer 512*a* may reflect light of blue (B), and the lower 1-2 light blocking layer 512*b* may reflect light of green (G), without being limited thereto. As an example, light of other colors (such as, magenta, cyan, or yellow) are also possible.

According to another embodiment of the present disclosure, since the light emitted by the leakage current from the second light emitting layer 2nd EML 332*b* and/or the third light emitting layer 3rd EML 332*c* provided on the side or upper surface of the first bank layer 321 is reflected and blocked by the upper 1-2 light blocking layer 512*a* and the lower 1-2 light blocking layer 512*b*, the light emitted by the leakage current, for example, the light of the second color and/or the third color may not reach the sensor module 20. Accordingly, according to an embodiment of the present disclosure, the first light blocking layer 510 may be provided to prevent the sensor module 20 from malfunctioning by the light emitted by the leakage current in the second light emitting layer 2nd EML 332*b* and/or the third light emitting layer 3rd EML 332*c*.

Each of the upper 1-2 light blocking layer 512*a* and the lower 1-2 light blocking layer 512*b* may include any one of the first to third liquid crystal capsules 501, 502 and 503 in FIG. 10. For example, the upper 1-2 light blocking layer 512*a* may include the second liquid crystal capsule (see 502 in FIG. 10) of the second size (see d2 in FIG. 10), and the lower 1-2 light blocking layer 512*b* may include the third liquid crystal capsule (see 503 in FIG. 10) of the third size (see d3 in FIG. 10). By forming in this way, light emitted from the second light emitting layer 2nd EML 322*b* and/or the third light emitting layer 332*c* by leakage current may be reflected by the upper 1-2 light blocking layer 512*a* and the lower 1-2 light blocking layer 512*b* to be blocked.

Furthermore, although not illustrated in detail, a 1-3 light blocking layer (see 513 of FIG. 9) may be included below the first bank layer 321 provided between the first sub-pixel SPa1 and the third sub-pixel SPa3. The 1-3 light blocking layer 513 of FIG. 9 may also include an upper 1-3 light blocking layer and a lower 1-3 light blocking layer overlapping each other, like the 1-1 light blocking layer 511 and the 1-2 light blocking layer 512, and a repeated description thereof is omitted. One of the upper 1-3 light blocking layer and the lower 1-3 light blocking layer may reflect light of the first color, for example, red (R), and another one of the upper 1-3 light blocking layer and the lower 1-3 light blocking layer may reflect light of the third color, for example, blue (B). Meanwhile, the description of the 1-3 light blocking layer is the same as that of the 1-1 light blocking layer and the 1-2 light blocking layer described above.

Figure 12:
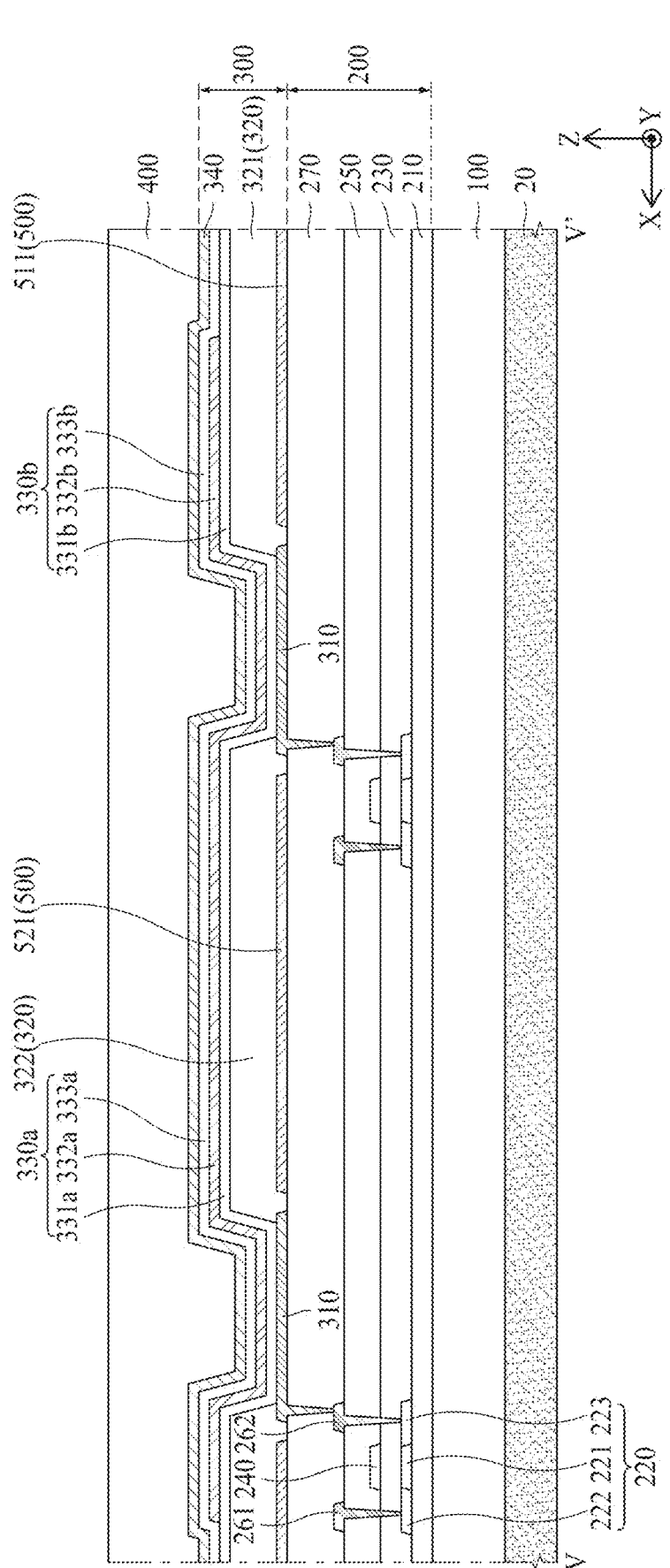
FIG. 12 is a cross-sectional view of an organic light emitting display device according to another embodiment of the present disclosure. In this case, FIG. 12 corresponds to the cross-section V-V' of FIG. 9.

FIG. 12 is a cross-sectional view of an organic light emitting display device according to another embodiment of the present disclosure. In this case, FIG. 12 corresponds to the cross-section V-V' of FIG. 9. FIG. 12 is a cross-sectional view of two adjacent first sub-pixels SPa1 among a plurality of first sub-pixels SPa1. Meanwhile, since the embodiment of FIG. 12 shows another cross-sectional view of the same embodiment as the embodiment of FIG. 10, the same reference numerals are assigned to the same configuration, and different configurations will be mainly described below.

As shown in FIG. 12, an organic light emitting display device according to another embodiment of the present disclosure may include a substrate 100, a circuit element layer 200, a light emitting element layer 300, an encapsulation layer 400, a light blocking layer 500, and a sensor module 20.

An organic light emitting display device according to another embodiment of the present disclosure may include a plurality of first sub-pixels SPa1, a second bank layer 322 (320) provided between the plurality of first sub-pixels SPa1, and a 2-1 light blocking layer 521 (500) overlapping the second bank layer 322.

The plurality of first sub-pixels SPa1 may emit light of a first color, and the first color may be any one of red (R), green (G), and blue (B). The first color may be, for example, red (R), without being limited thereto. As an example, other colors (such as, magenta, cyan, or yellow) are also possible.

The second bank layer 322 may be provided between two adjacent first sub-pixels SPa1 among the plurality of first sub-pixels SPa1.

The 2-1 light blocking layer 521 may be provided between adjacent first sub-pixels SPa1 among the plurality of first sub-pixels SPa1, for example, on the planarization layer 270 and under the second bank layer 322, but is not limited thereto.

According to another embodiment of the present disclosure, the 2-1 light blocking layer 521 may include at least one of a first liquid crystal capsule (see 501 of FIG. 6) to a third liquid crystal capsule (see 503 of FIG. 6). Accordingly, the 2-1 light blocking layer 521 may include, for example, a first liquid crystal capsule (see 501 of FIG. 6) having a first size (see d1 of FIG. 6). In this case, the 2-1 light blocking layer 521 may reflect light of a first color of the first light emitting layer 1st EML 322*a* of the first sub-pixel SPa1 provided on an upper surface or a side surface of the second bank layer 321. According to another embodiment of the present disclosure, since only a first liquid crystal capsule (see 501 of FIG. 6) reflecting light of a first color is included between a plurality of first sub-pixels SPa1 arranged in the first direction X, light of a first color emitted by a leakage current may be effectively reflected from a region between two adjacent first sub-pixels SPa1 of the plurality of first sub-pixels SPa1.

As another example, the 2-1 light blocking layer 521 may include a first liquid crystal capsule having a first size (see d1 of FIG. 6) and a second liquid crystal capsule having a second size (see d2 of FIG. 6). In this case, the 2-1 light blocking layer 521 may reflect light of a first color, for example, red (R) light of the first light emitting layer 1st EML 322a of the first sub-pixel SP1a provided on an upper surface or a side surface of the second bank layer 322.

Meanwhile, the 2-1 light blocking layer 521 provided between the plurality of first sub-pixels SPa1 is mainly described in FIG. 12, but the present disclosure is not limited thereto, and may also be applied to the 2-2 light blocking layer 522 provided between the plurality of second sub-pixels SPa2 and the 2-3 light blocking layer 523 provided between the plurality of third sub-pixels SPa3.

Accordingly, the present disclosure may have the following advantages.

According to an embodiment of the present disclosure, by forming a light blocking layer overlapping the bank layer, light generated from a light emitting layer partially provided on the side or upper surface of the bank layer can be reflected by the light blocking layer, thereby preventing or at least reducing the light reaching the sensor module, and the sensor module can be prevented from malfunctioning.

According to an embodiment of the present disclosure, the light blocking layer includes first to third liquid crystal capsules for blocking light of different colors such as red, green, and blue light, respectively, and the light blocking layer including the first to third liquid crystal capsules is formed in an area overlapping the bank layer, thereby shortening the manufacturing process time.

According to an embodiment of the present disclosure, a light blocking layer including a first liquid crystal capsule reflecting light of the first color and a second liquid crystal capsule reflecting light of the second color may be formed between the first sub-pixel emitting the first color and the second sub-pixel emitting the second color, thereby improving the degree to which light of the first color and light of the second color are reflected.

According to an embodiment of the present disclosure, a light blocking layer including only a first liquid crystal capsule reflecting light of the first color may be formed between two adjacent first sub-pixels of the plurality of first sub-pixels, thereby improving the degree to which light of the first color is reflected.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. An organic light emitting display device, comprising:
a substrate;
a first sub-pixel including a first electrode, a light emitting layer on the first electrode, a second electrode on the light emitting layer, and a driving transistor on the substrate, the first electrode connected to the driving transistor, the first sub-pixel emitting light of a first color;
a second sub-pixel on the substrate, the second sub-pixel emitting light of a second color different from the first color;
a bank layer including a first bank layer between the first sub-pixel and the second sub-pixel, the bank layer defining the first sub-pixel and the second sub-pixel; and a first light blocking layer under the first bank layer, wherein an entire area of the first light blocking layer overlaps the first bank layer,
wherein the first light blocking layer is between the driving transistor and the second electrode in a cross-sectional view of the organic light emitting display device,
wherein the first light blocking layer overlaps in part with the driving transistor in a plan view of the organic light emitting display device,
wherein the first light blocking layer includes a first liquid crystal capsule having a first size,
wherein the first light blocking layer reflects at least one of the light of the first color and the light of the second color, and
wherein the first bank layer is provided on the first electrode, a partial region of an upper surface of the first electrode exposed to become a light emitting region without being covered by the first bank layer, and the first light blocking layer nonoverlapping the light emitting region.

2. The organic light emitting display device according to claim 1, further comprising:
an infrared sensor module under the substrate, the infrared sensor module detecting light in an infrared wavelength band.

3. The organic light emitting display device according to claim 2, wherein the infrared sensor module overlaps the first light blocking layer.

4. The organic light emitting display device according to claim 1, wherein:
the first light blocking layer further includes a second liquid crystal capsule having a second size different from the first size,
the first liquid crystal capsule reflects any one of the light of the first color and the light of the second color, and
the second liquid crystal capsule reflects another one of the light of the first color and the light of the second color.

5. The organic light emitting display device according to claim 1, further comprising:
a first insulating layer on the substrate; and
a second insulating layer on the first insulating layer,
wherein the first light blocking layer is on a same layer as the first electrode on the second insulating layer.

6. The organic light emitting display device according to claim 1, further comprising:
a first insulating layer on the substrate; and
a second insulating layer on the first insulating layer,
wherein the first light blocking layer is between the first insulating layer and the second insulating layer.

7. The organic light emitting display device according to claim 1, further comprising:
a second light blocking layer including a second liquid crystal capsule under the first bank layer, the second light blocking layer having a second size different from the first size,
wherein the first light blocking layer reflects any one of the light of the first color and the light of the second color, and the second light blocking layer reflects another one of the light of the first color and the light of the second color, and
wherein the first light blocking layer and the second light blocking layer are on different layers.

8. The organic light emitting display device according to claim 7, further comprising:
a first insulating layer on the substrate; and a second insulating layer on the first insulating layer, wherein the first light blocking layer is on a same layer as the first electrode on the second insulating layer, and wherein the second light blocking layer is between the first insulating layer and the second insulating layer.

9. The organic light emitting display device according to claim 1, further comprising:

a third sub-pixel on the substrate, the third sub-pixel emitting light of a third color;

a second bank layer between the second sub-pixel and the third sub-pixel; and a third light blocking layer under the second bank layer, wherein the third light blocking layer includes a third liquid crystal capsule having a third size different from the first size, and wherein the third light blocking layer reflects at least one of the light of the second color and the light of the third color.

10. The organic light emitting display device according to claim 9, wherein the third light blocking layer comprises:

an upper 1-2 light blocking layer under the second bank layer; and a lower 1-2 light blocking layer overlapping the upper 1-2 light blocking layer, wherein the upper 1-2 light blocking layer reflects any one of the light of the second color and the light of the third color, and the lower 1-2 light blocking layer reflects another one of the light of the second color and the light of the third color.

11. The organic light emitting display device according to claim 10, wherein a length of the upper 1-2 light blocking layer is greater than a length of the lower 1-2 light blocking layer, and wherein the upper 1-2 light blocking layer and the lower 1-2 light blocking layer have a same thickness or different thicknesses.

12. The organic light emitting display device according to claim 1, further comprising:

a third sub-pixel on the substrate, the third sub-pixel emitting light of a third color, a third bank layer between the third sub-pixel and the first sub-pixel, and a 1-3 light blocking layer under the third bank layer, and wherein the 1-3 light blocking layer reflects any one of the light of the third color and the light of the first color.

13. The organic light emitting display device according to claim 12, wherein the 1-3 light blocking layer comprises:

an upper 1-3 light blocking layer under the third bank layer; and a lower 1-3 light blocking layer overlapping the upper 1-3 light blocking layer, wherein the upper 1-3 light blocking layer reflects any one of the light of the third color and the light of the first color, and the lower 1-3 light blocking layer reflects another one of the light of the third color and the light of the first color.

14. The organic light emitting display device according to claim 9, wherein the first size of the first liquid crystal capsule of the first light blocking layer is a same as the third size of the third liquid crystal capsule of the third light blocking layer.

15. The organic light emitting display device according to claim 1, wherein the first size of the first liquid crystal capsule is in a range of 110 nm to 140 nm, a range of 125 nm to 165 nm, or a range of 150 nm to 175 nm.

16. An organic light emitting display device, comprising:

a substrate;

a plurality of first sub-pixels including a first electrode, a light emitting layer on the first electrode, a second electrode on the light emitting layer, and a driving transistor on the substrate, the first electrode connected to the driving transistor, the plurality of first sub-pixels emitting light of a first color;

a plurality of second sub-pixels on the substrate, the plurality of second sub-pixels emitting light of a second color;

a first bank layer between a first sub-pixel of the plurality of first sub-pixels and a second sub-pixel of the plurality of second sub-pixels, the first bank layer extending in a first direction;

a second bank layer between adjacent first sub-pixels of the plurality of first sub-pixels, the second bank layer extending in a second direction;

a first light blocking layer overlapping the first bank layer and provided under the first bank layer;

a second light blocking layer overlapping the second bank layer and provided under the second bank layer; and a sensor module under the substrate, the sensor module detecting light, wherein the first light blocking layer is between the driving transistor and the second electrode in a cross-sectional view of the organic light emitting display device, wherein the first light blocking layer overlaps in part with the driving transistor in a plan view of the organic light emitting display device, wherein the sensor module overlaps the first light blocking layer and the second light blocking layer, and wherein the first bank layer is provided on the first electrode, a partial region of an upper surface of the first electrode exposed to become a light emitting region without being covered by the first bank layer.

17. The organic light emitting display device according to claim 16, wherein the first light blocking layer has a same configuration as the second light blocking layer.

18. The organic light emitting display device according to claim 17, wherein each of the first light blocking layer and the second light blocking layer includes a first liquid crystal capsule of a first size, a second liquid crystal capsule of a second size, and a third liquid crystal capsule of a third size.

19. The organic light emitting display device according to claim 16, wherein the first light blocking layer has a configuration that is different from a configuration of the second light blocking layer.

20. The organic light emitting display device according to claim 19, wherein:

the first light blocking layer includes a first liquid crystal capsule of a first size and a second liquid crystal capsule of a second size; and the second light blocking layer includes the first liquid crystal capsule of the first size.

21. The organic light emitting display device according to claim 19, wherein:

the first light blocking layer includes a first liquid crystal capsule having a first size and a second liquid crystal capsule having a second size; and the second light blocking layer includes the first liquid crystal capsule having the first size, the second liquid crystal capsule having the second size, and a third liquid crystal capsule having a third size.

22. The organic light emitting display device according to claim 16, wherein the first light blocking layer is between the first bank layer and the sensor module.

23. The organic light emitting display device according to claim 16, wherein the first light blocking layer and the second light blocking layer are on a same layer.

24. The organic light emitting display device according to claim 16, wherein the first light blocking layer and the second light blocking layer are on different layers.

* * * * *